(12) United States Patent
Anezaki

(10) Patent No.: US 8,574,984 B2
(45) Date of Patent: Nov. 5, 2013

(54) MANUFACTURING METHOD OF SEMICONDUCTOR INTEGRATED CIRCUIT DEVICE

(75) Inventor: Toru Anezaki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/537,223

(22) Filed: Jun. 29, 2012

(65) Prior Publication Data

US 2012/0289011 A1    Nov. 15, 2012

Related U.S. Application Data

(62) Division of application No. 13/075,716, filed on Mar. 30, 2011.

(30) Foreign Application Priority Data

Apr. 16, 2010  (JP) .................................. 2010-095107

(51) Int. Cl.
*H01L 21/8242*    (2006.01)

(52) U.S. Cl.
USPC ........................... 438/239; 257/300; 257/312

(58) Field of Classification Search
USPC .................................. 438/239; 257/300, 312
See application file for complete search history.

(56) References Cited

U.S. PATENT DOCUMENTS

| | | | |
|---|---|---|---|
| 5,208,725 A | 5/1993 | Akcasu | |
| 5,583,359 A | 12/1996 | Ng et al. | |
| 5,978,206 A | 11/1999 | Nishimura et al. | |
| 6,635,916 B2 | 10/2003 | Aton | |
| 6,737,698 B1 | 5/2004 | Paul et al. | |
| 7,348,624 B2 | 3/2008 | Sakaguchi et al. | |

FOREIGN PATENT DOCUMENTS

JP    2006-128164 A    5/2006

*Primary Examiner* — Marvin Payen
(74) *Attorney, Agent, or Firm* — Westerman, Hattori, Daniels & Adrian, LLP

(57) ABSTRACT

A method of manufacturing a semiconductor integrated circuit device includes defining a first area by forming a separating area on a substrate, and forming a tunnel film in the first area, a floating gate on the tunnel film, a first electrode in the separating area, a first film on the floating gate, a second film on the first electrode, a control gate on the first film, a second electrode on the second film, and source and drain areas in the first area. The method includes forming a first interlayer film to cover the control gate and the second electrode, forming, in the first interlayer film, a conductive via plug reaching the second electrode, and forming, on the first interlayer film, a second wiring electrically coupled to the second electrode via the conductive via plug, and a first wiring that is capacitively-coupled to the second wiring and to the second electrode.

4 Claims, 40 Drawing Sheets

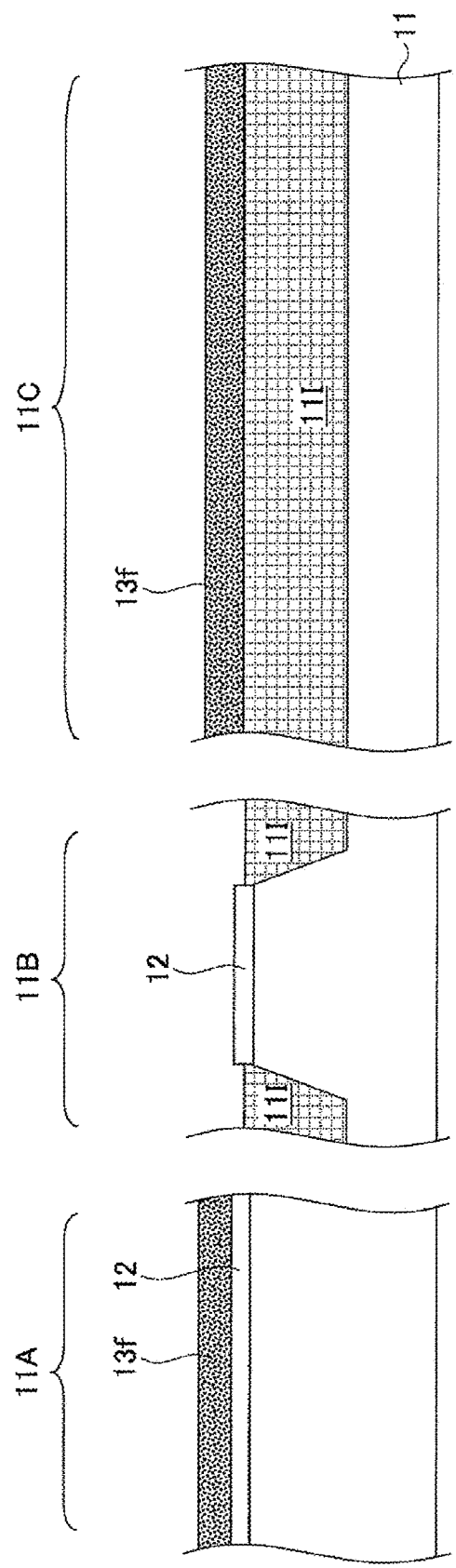

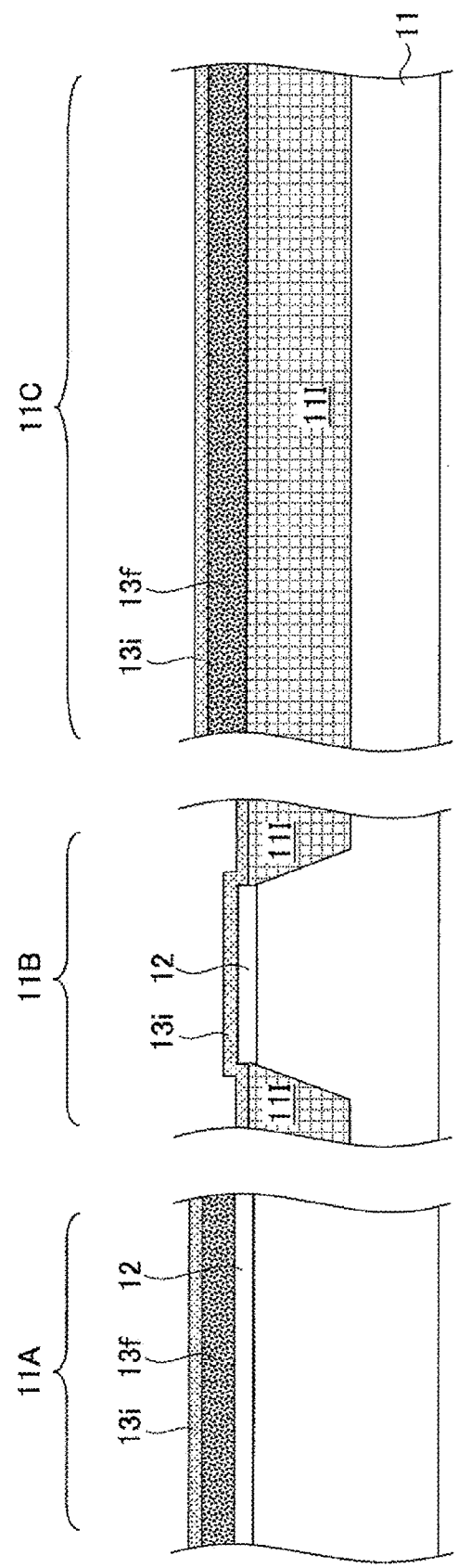

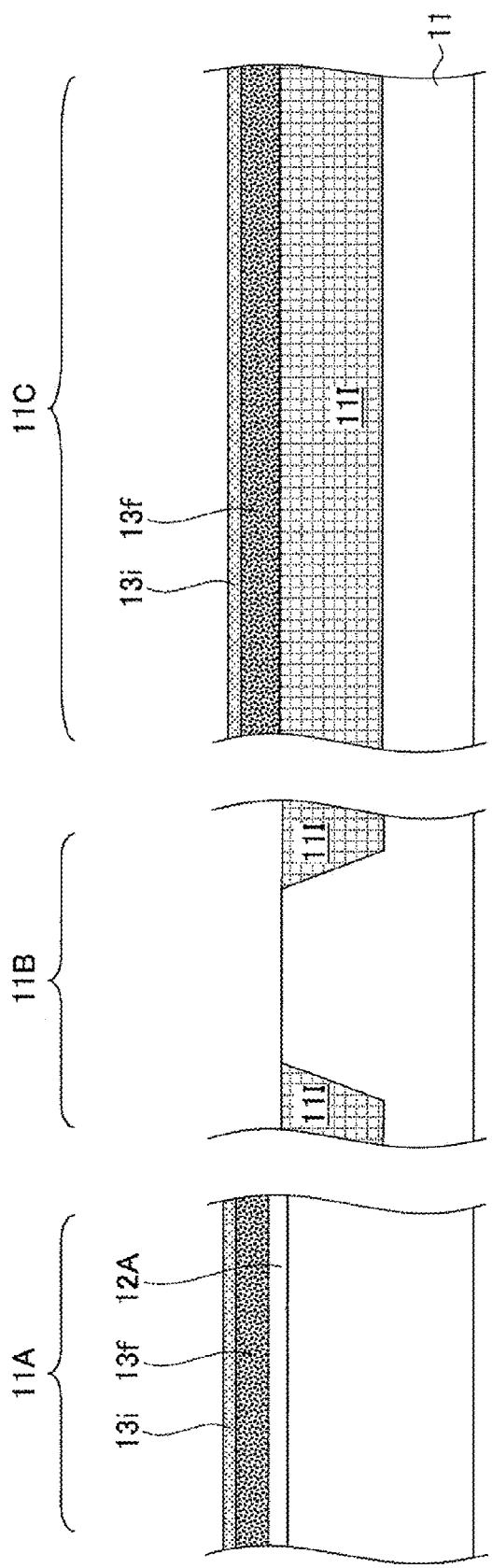

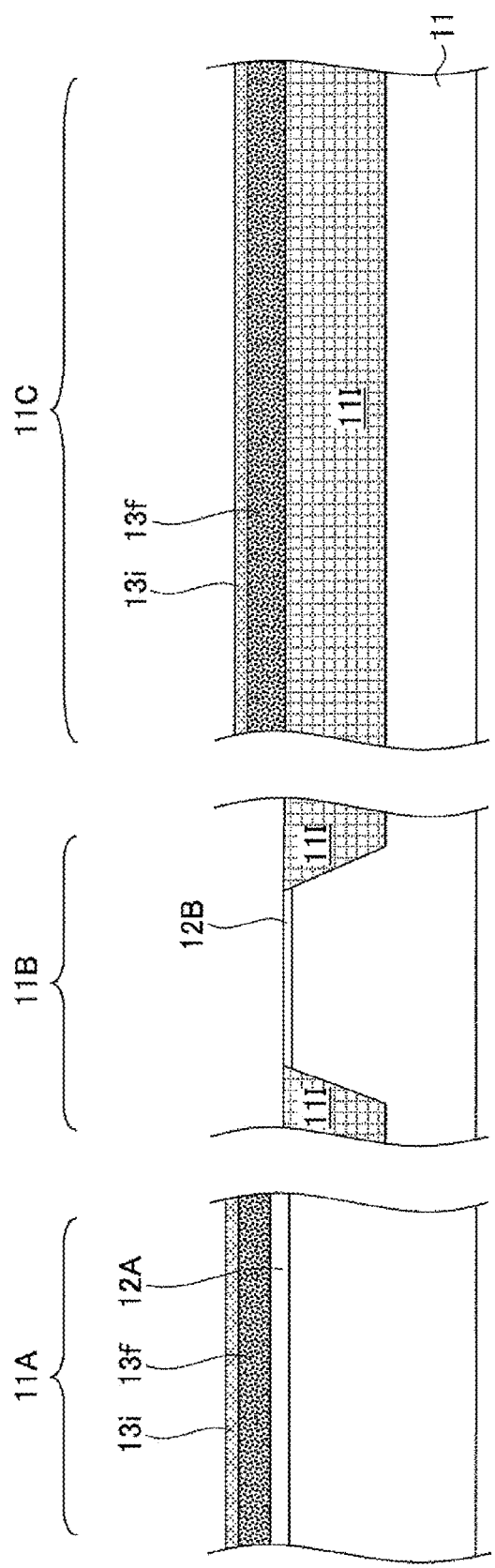

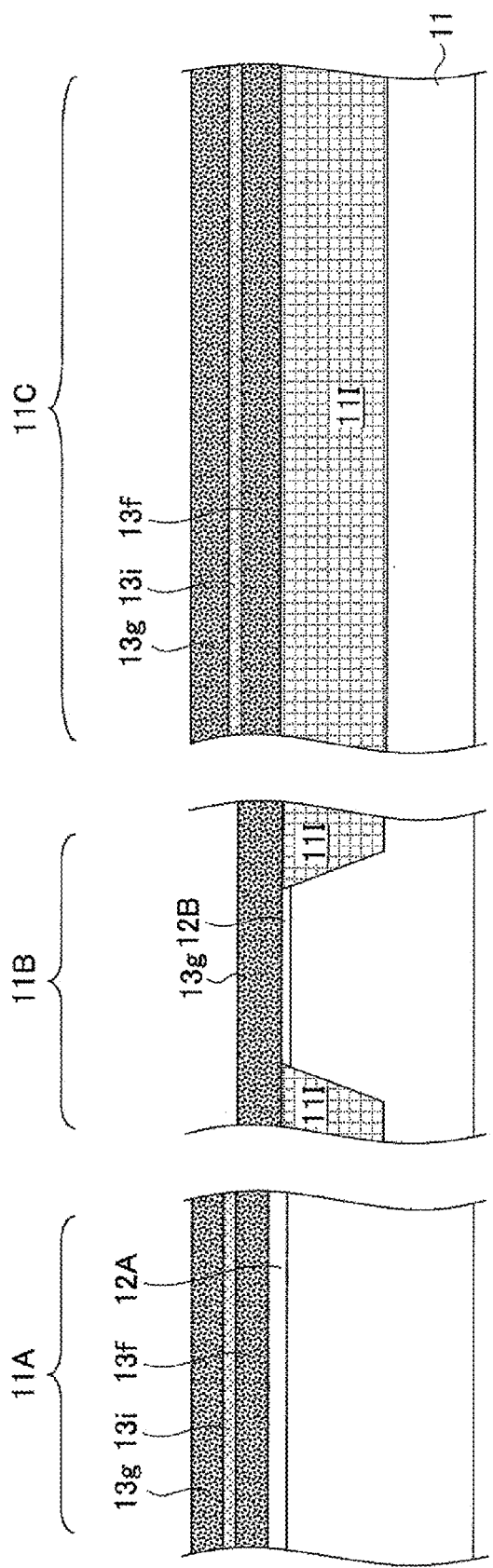

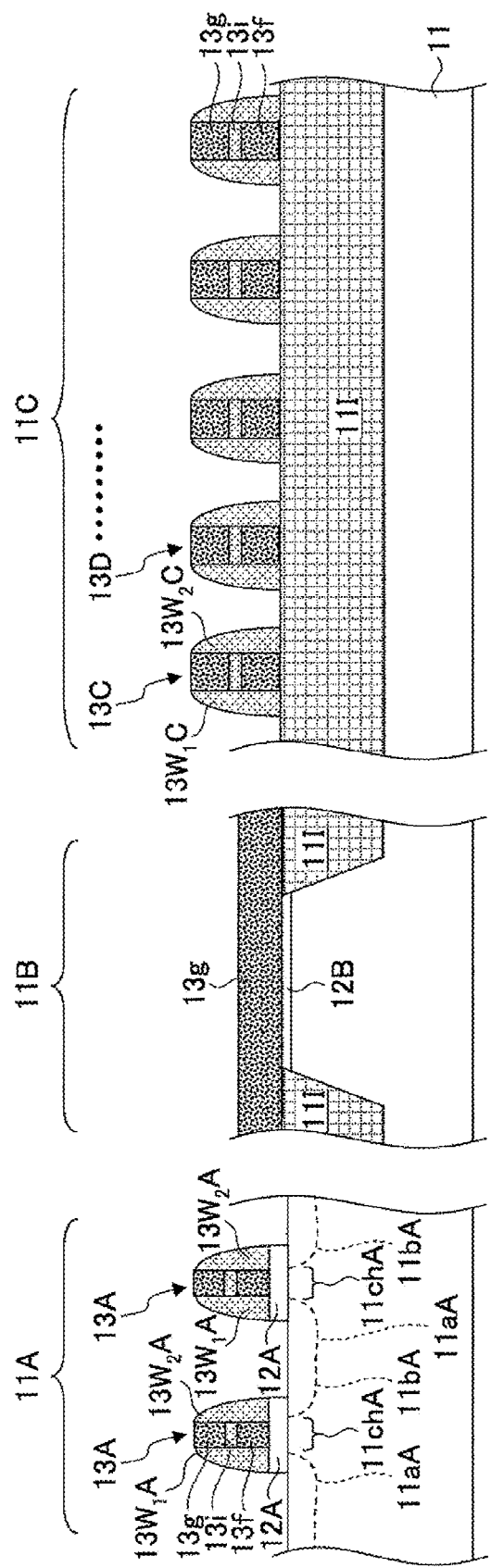

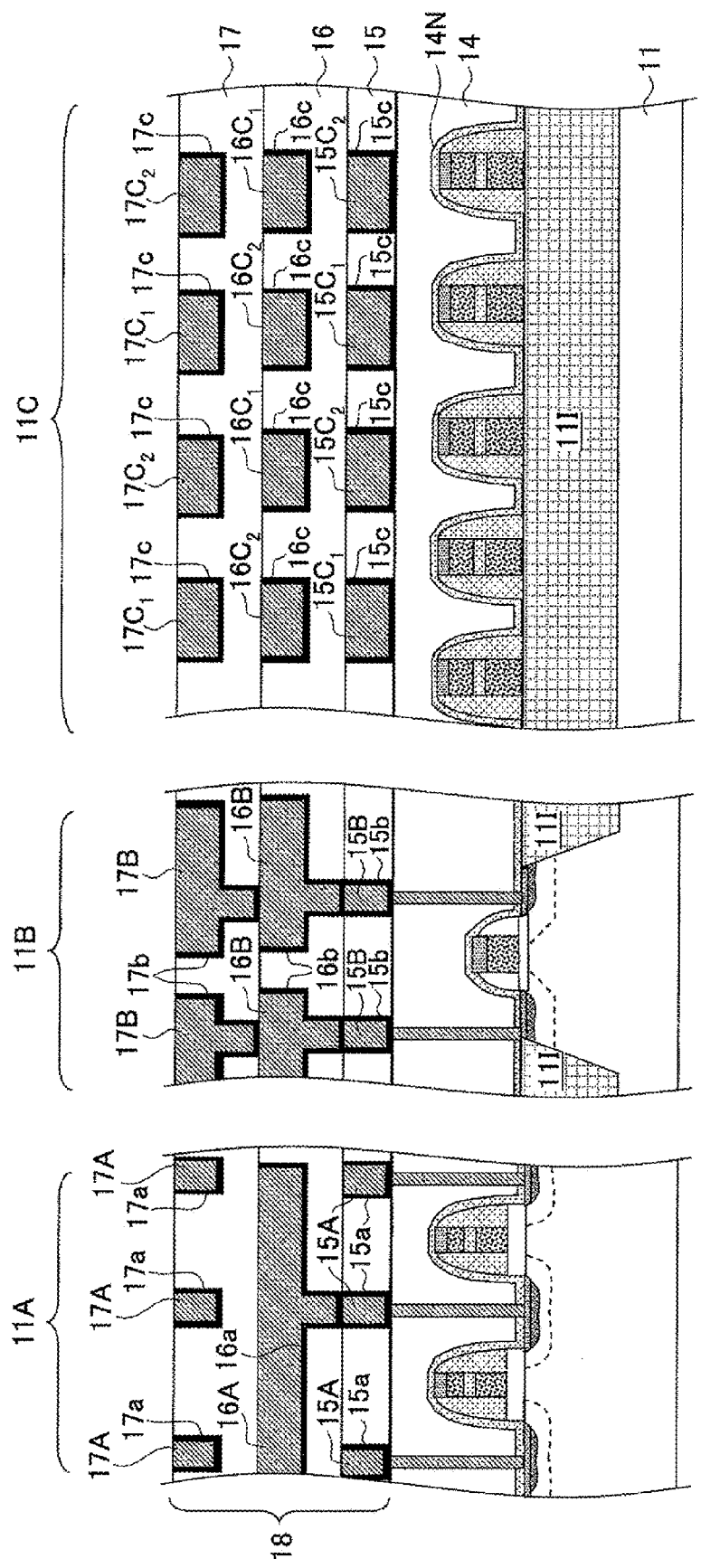

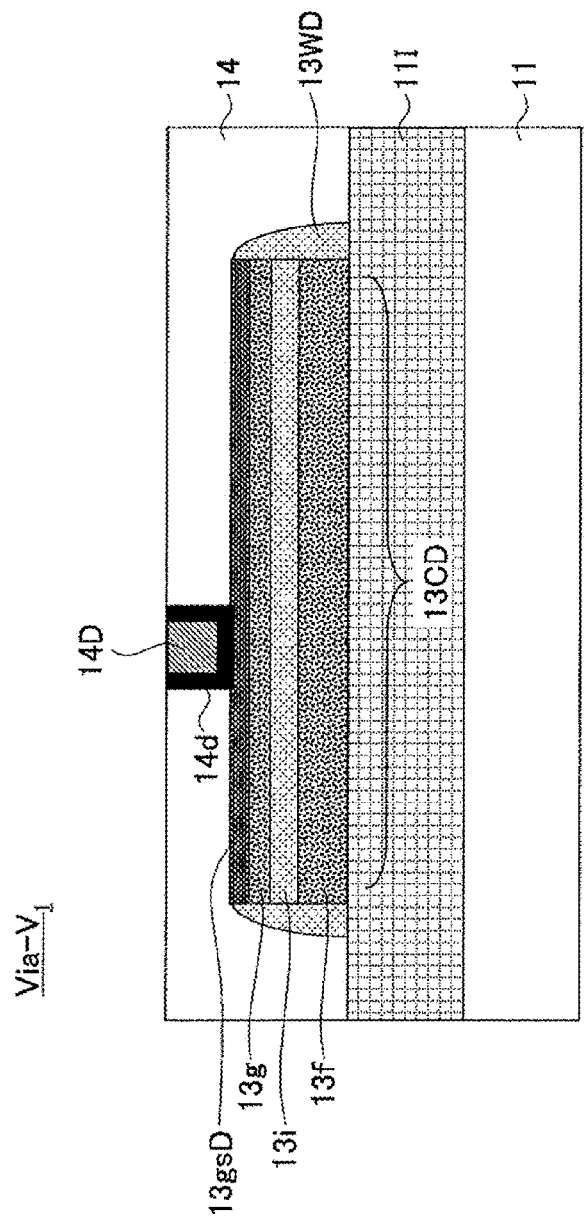

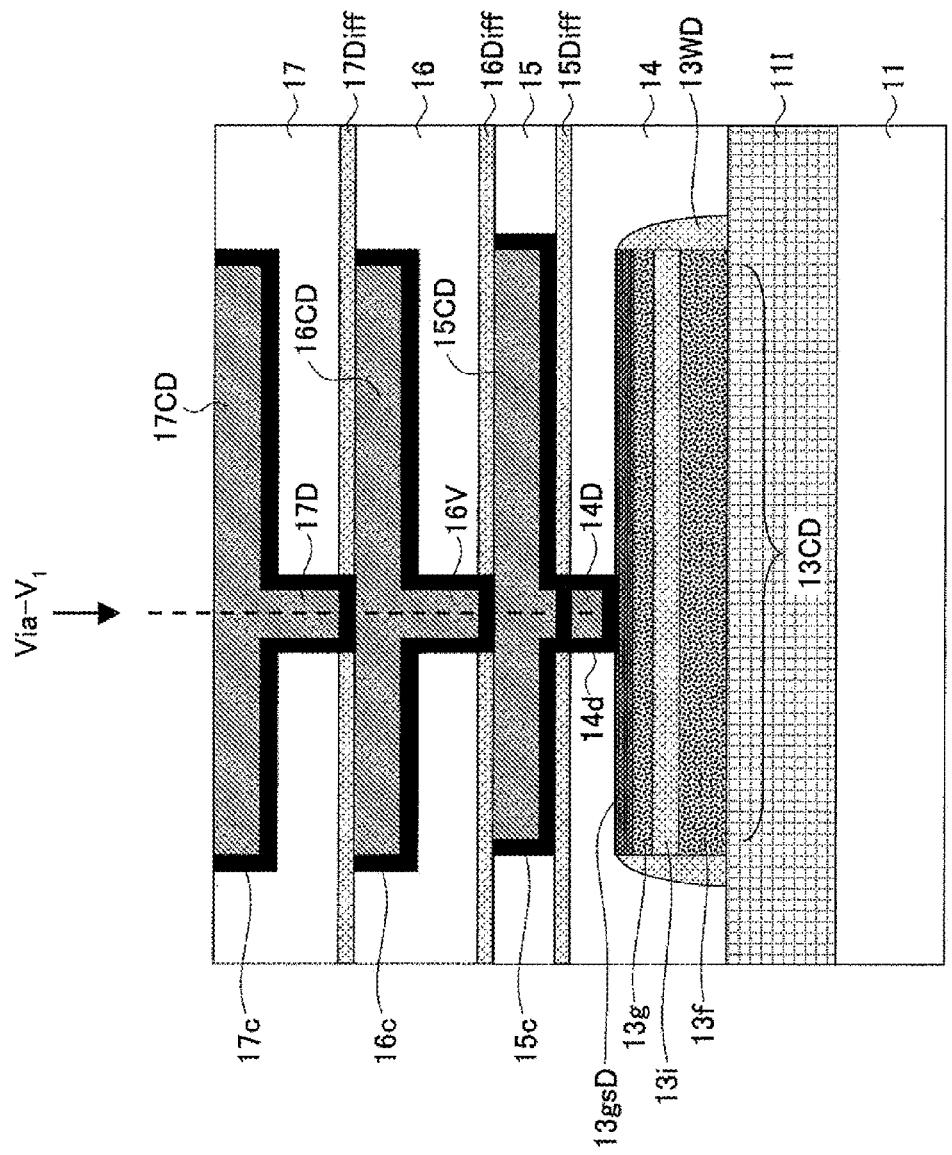

MANUFACTURING METHOD OF SEMICONDUCTOR INTEGRATED CIRCUIT DEVICE

CROSS-REFERENCE TO RELATED APPLICATION

This patent application is a divisional application of Serial application Ser. No. 13/075,716, filed Mar. 30, 2011, based upon and claims the benefit of priority of the prior Japanese Patent Application No. 2010-095107 filed on Apr. 16, 2010, the entire contents of which are incorporated herein by reference.

FIELD

The embodiments discussed herein are generally related to semiconductor devices, and more specifically to a semiconductor integrated circuit device in which a non-volatile semiconductor device and an analog capacitor are integrated, and a manufacturing method thereof.

BACKGROUND

A flash memory is a non-volatile semiconductor storage device for accumulating information in a floating gate electrode, in the form of electric charges. A flash memory has a simple configuration, and is thus appropriately used for configuring a large-scale integrated circuit device.

A typical flash memory is formed as follows. On a silicon substrate, a floating gate electrode made of polysilicon is formed via a tunnel insulating film made of a thermally-oxidized film or the like. A stacked gate structure formed by laminating control gate electrodes, is formed on the floating gate electrode via an interlayer insulating film. In the silicon substrate, a source area and a drain area are formed on a first side of the stacked gate structure and a second side of the stacked gate structure, respectively.

Patent document 1: Japanese Laid-Open Patent Publication No. 2006-128164
Patent document 2: U.S. Pat. No. 6,635,916
Patent document 3: U.S. Pat. No. 5,583,359
Patent document 4: U.S. Pat. No. 7,348,624
Patent document 5: U.S. Pat. No. 5,208,725
Patent document 6: U.S. Pat. No. 6,737,698
Patent document 7: U.S. Pat. No. 5,978,206

Meanwhile, recently, there is demand for a semiconductor integrated circuit device in which such a non-volatile semiconductor device is integrated on a common semiconductor substrate together with an analog device having an analog capacitor, and a logical device.

In such a semiconductor integrated circuit device in which an analog device is integrated, if an analog capacitor in which a lower electrode pattern and an upper electrode pattern are facing each other in a vertical direction is formed via an interlayer insulating film, it may be difficult to attain sufficient capacitance.

Therefore, in the conventional technology, there has been proposed a semiconductor integrated circuit device in which wiring patterns formed in a multilayer wiring structure are used for forming a comb-tooth type analog capacitor.

However, recently, an ultra-miniaturized semiconductor device including such a comb-tooth type capacitor formed in a multilayer wiring structure is demanded to have even higher capacitance, in accordance with the miniaturization of patterns.

SUMMARY

According to an aspect of the invention, a semiconductor integrated circuit device includes a semiconductor substrate including a first element area that is defined by an element separating area; a flash memory cell including a tunnel insulating film formed in the first element area of the semiconductor substrate, a floating gate formed above the tunnel insulating film, a first insulating film formed above the floating gate, a control gate formed above the first insulating film, and a source area and a drain area formed in the semiconductor substrate in the first element area; a first laminated wiring pattern formed above the semiconductor substrate outside the first element area, the first laminated wiring pattern including a first electrode pattern, a second insulating film formed above the first electrode pattern, and a second electrode pattern formed above the second insulating film; a first interlayer insulating film formed above the flash memory cell and the first laminated wiring pattern on the semiconductor substrate; and a first wiring layer formed in the first interlayer insulating film, the first wiring layer including a first wiring pattern connected to a first power source, and a second wiring pattern connected to a second power source, wherein the first wiring pattern and the second wiring pattern are capacitively-coupled to form a first capacitor, the first wiring pattern is formed above the first laminated wiring pattern, and the first wiring pattern and the second electrode pattern are capacitively-coupled to form a second capacitor, and the second electrode pattern is electrically coupled to the second wiring pattern.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 10D illustrates the manufacturing method of the semiconductor integrated circuit device illustrated in FIG. 1 (part 4);

FIG. 10E illustrates the manufacturing method of the semiconductor integrated circuit device illustrated in FIG. 1 (part 5);

FIG. 10F illustrates the manufacturing method of the semiconductor integrated circuit device illustrated in FIG. 1 (part 6);

FIG. 10G illustrates the manufacturing method of the semiconductor integrated circuit device illustrated in FIG. 1 (part 7);

FIG. 10H illustrates the manufacturing method of the semiconductor integrated circuit device illustrated in FIG. 1 (part 8);

FIG. 10K illustrates the manufacturing method of the semiconductor integrated circuit device illustrated in FIG. 1 (part 11);

FIG. 10O illustrates the manufacturing method of the semiconductor integrated circuit device illustrated in FIG. 1 (part 15);

FIG. 10S illustrates the manufacturing method of the semiconductor integrated circuit device illustrated in FIG. 1 (part 19);

FIG. 12A illustrates details of the process of forming a via contact in the step of FIG. 10S (part 1);

FIG. 12E illustrates details of the process of forming the via contact in the step of FIG. 10S (part 5);

DESCRIPTION OF EMBODIMENTS

Preferred embodiments of the present invention will be explained with reference to accompanying drawings.
First Embodiment FIG. 1 is a cross-sectional view for describing the overview of a semiconductor integrated circuit device 10 according to a first embodiment.

Figure 1:
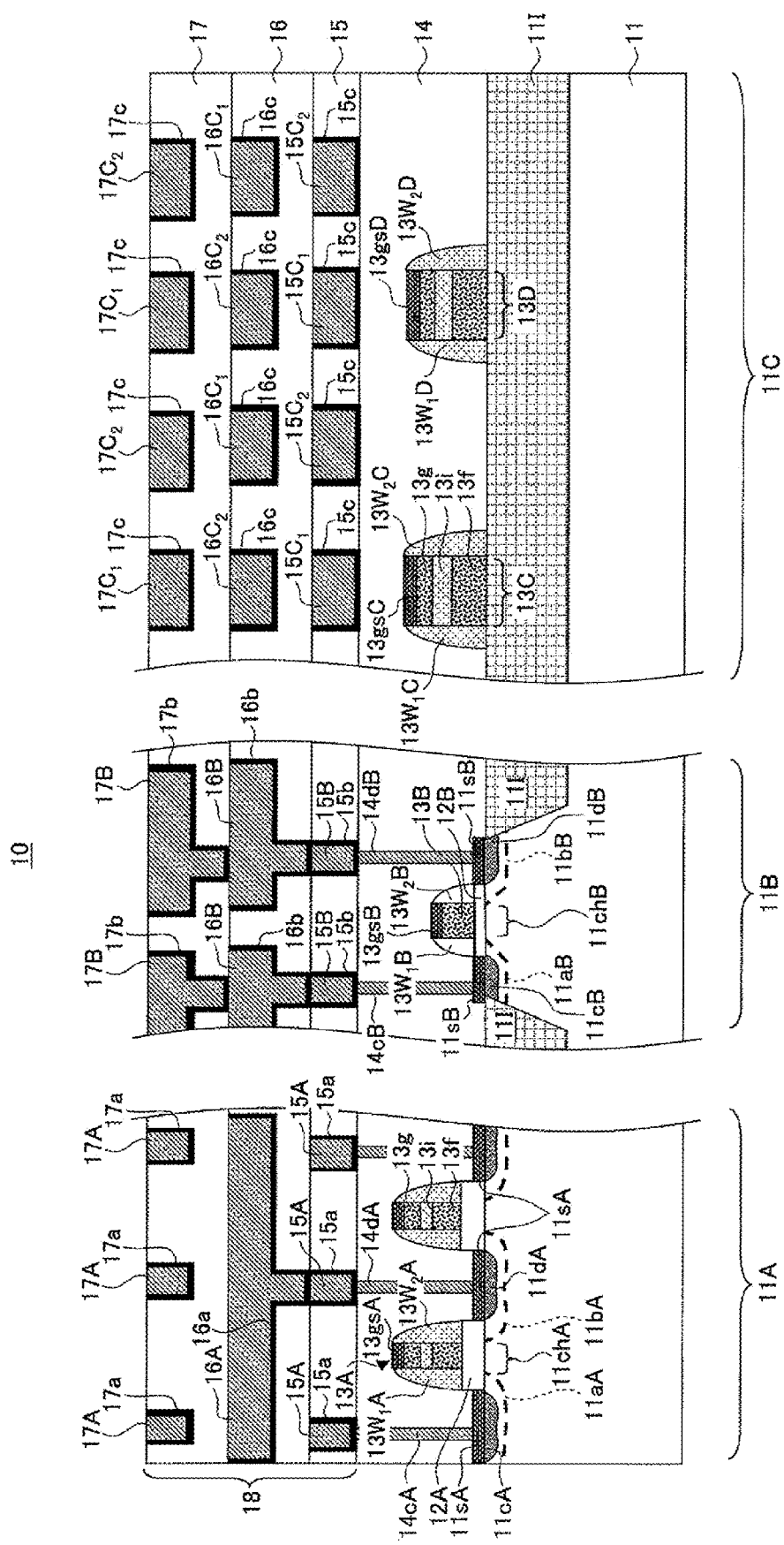
FIG. 1 is a cross-sectional view for describing the overview of a semiconductor integrated circuit device according to a first embodiment.
Figure 2:
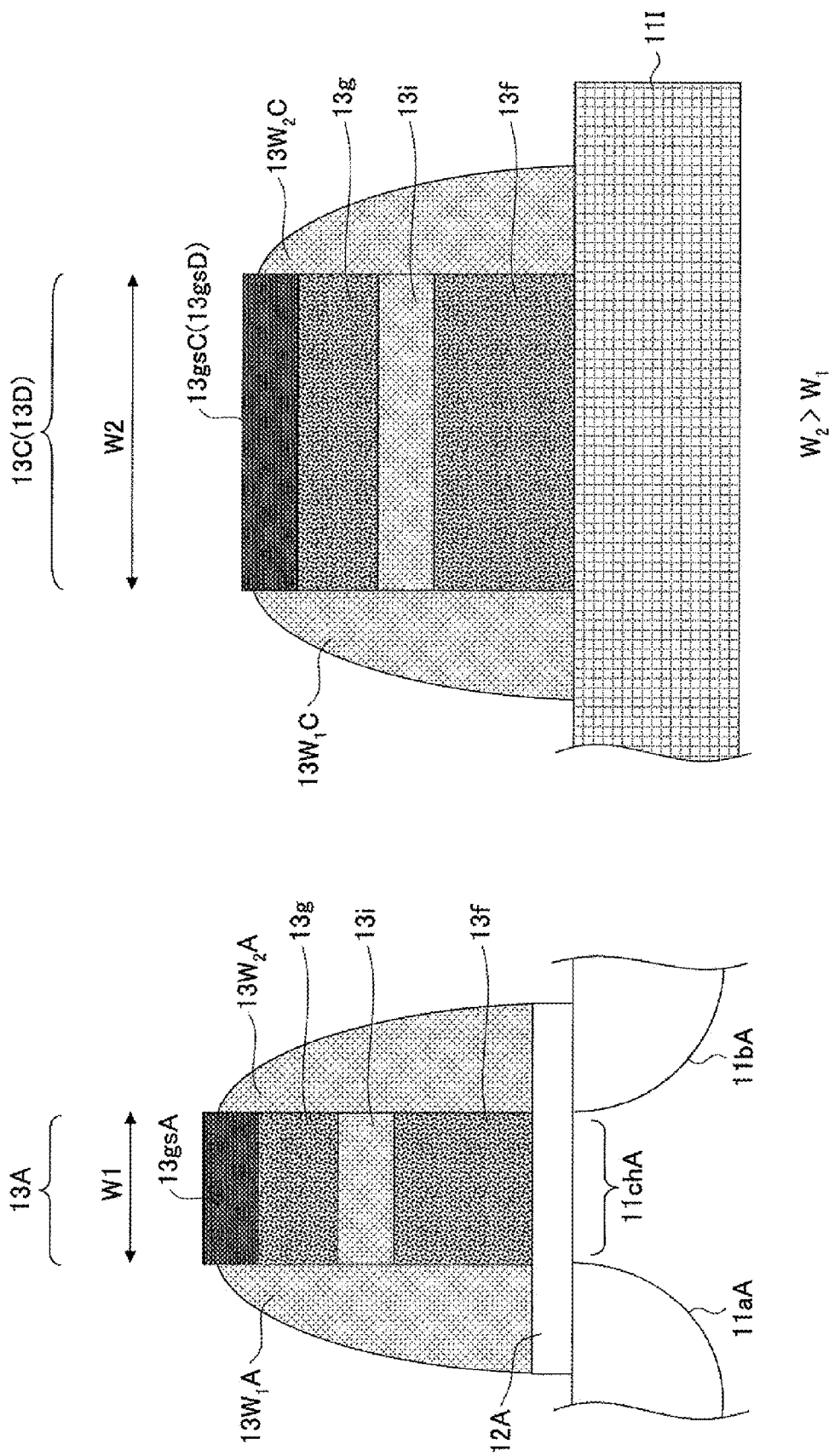
FIG. 2 is a cross-sectional view of laminated wiring patterns in the semiconductor integrated circuit device illustrated in FIG. 1.

Referring to FIG. 1, the semiconductor integrated circuit device 10 is formed on a silicon substrate 11. The silicon substrate 11 has element areas 11A and 11B, which are defined by an element separating area 11I having an STI structure. As illustrated in an enlarged view of FIG. 2 (on the left side), the element area 11A has a stacked gate electrode 13A formed via a tunnel insulating film 12A. The stacked gate electrode 13A has a structure in which a floating gate electrode formed with a polysilicon layer $13f$ and a control gate electrode formed with a polysilicon layer $13g$ are sequentially laminated via an inter-electrode insulating layer $13i$ formed with an insulating film having an ONO structure. The polysilicon layers $13f$ and $13g$ are high-density doped to be an n+ type layer or a p+ type layer.

In the element area 11A of the silicon substrate 11, LDD areas $11aA$ and $11bA$ that are n− type areas or p− type areas are formed, in such a manner as to face each other across a channel area 11ChA that is immediately below the stacked gate electrode 13A. Furthermore, a side wall insulating film $13W_1A$ is formed on the side wall of the stacked gate electrode 13A on the LDD area $11aA$ side, and a side wall insulating film $13W_2A$ is formed on the side wall of the stacked gate electrode 13A on the LDD area $11bA$ side. In the silicon substrate 11, an n+ type or p+ type source extension area $11cA$ is formed on the outside of the side wall insulating film $13W_1A$ as viewed from the channel area 11ChA. Furthermore, in the silicon substrate 11, an n+ type or p+ type drain extension area $11dA$ is formed on the outside of the side wall insulating film $13W_2A$ as viewed from the channel area 11ChA. The stacked gate electrode 13A forms a single flash memory cell together with the tunnel insulating film 12A, the channel area 11ChA, the LDD areas $11aA$ and $11bA$, the source extension area $11cA$, and the drain extension area $11dA$, which are located below the stacked gate electrode 13A. Typically, when the polysilicon layer $13f$ forming the floating gate electrode and the polysilicon layer $13g$ forming the control gate electrode are doped to be an n+ type, the LDD areas $11aA$ and $11bA$ are doped to be an n− type, and the source extension area $11cA$ and the drain extension area $11dA$ are doped to be an n+ type. Furthermore, when the polysilicon layer $13f$ forming the floating gate electrode and the polysilicon layer $13g$ forming the control gate electrode are doped to be a p+ type, the LDD areas $11aA$ and $11bA$ are doped to be a p− type, and the source extension area $11cA$ and the drain extension area $11dA$ are doped to be a p+ type.

In the example illustrated in FIG. 1, there are many flash memory cells in the element area 11A, and adjacent flash memory cells share a common source extension area 11cA, a common drain extension area 11dA, and common LDD areas 11aA and 11bA. These flash memory cells are repetitively formed, to form an NAND type memory cell array. On the surfaces of the source extension area 11cA and the drain extension area 11dA, a low-resistance silicide layer 11sA is formed. A similar silicide layer 13gsA is formed on the surface of the polysilicon layer 13g. However, the present embodiment is not limited to an NAND type memory cell array; the present embodiment is also applicable to, for example, an NOR type memory cell array.

Meanwhile, in the element area 11B, a gate electrode 13B made of a single-layered polysilicon film is formed on the silicon substrate 11 via a gate insulating film 12B that is thinner than the tunnel insulating film 12A. Furthermore, in the element area 11B of the silicon substrate 11, LDD areas 11aB and 11bB that are n− type areas or p− type areas are formed, in such a manner as to face each other across a channel area 11ChB that is immediately below the gate electrode 13B. Furthermore, a side wall insulating film $13W_1B$ is formed on the side wall of the single-layered gate electrode 13B on the LDD area 11aB side, and a side wall insulating film $13W_2B$ is formed on the side wall of the single-layered gate electrode 13B on the LDD area 11bB side. In the silicon substrate 11, there is formed an n+ type or p+ type source extension area 11cB on the outside of the side wall insulating film $13W_1B$ as viewed from the channel area 11ChB. Furthermore, in the silicon substrate 11, there is formed an n+ type or p+ type drain extension area 11dB on the outside of the side wall insulating film $13W_2B$ as viewed from the channel area 11ChB. The single-layered gate electrode 13B forms a single high-speed logic transistor together with the gate insulating film 12B, the channel area 11ChB, the LDD areas 11aB and 11bB, the source extension area 11cB, and the drain extension area 11dB, which are located below the single-layered gate electrode 13B. The high-speed logic transistor may form, for example, a CMOS element, together with another similar high-speed logic transistor on the silicon substrate 11.

On the surfaces of the source extension area 11cB and the drain extension area 11dB, a low-resistance silicide layer 11sB is formed. A similar silicide layer 13gsB is formed on the surface of the single-layered gate electrode 13B.

In the semiconductor integrated circuit device 10 illustrated in FIG. 1, there is an area 11C formed by the element separating structure 11I, other than the element areas 11A and 11B. As illustrated in an enlarged view of FIG. 2 (on the right side), the area 11C has laminated wiring patterns 13C and 13D having the same layer structure as the stacked gate electrode 13A. The laminated wiring patterns 13C and 13D are formed in parallel to each other, and have a width W2 that is greater than a width W1 of the stacked gate electrode 13A. Furthermore, similar to the case of the stacked gate electrode 13A, side wall insulating films $13W_1C$ and $13W_2C$ are formed on opposite side walls of the laminated wiring pattern 13C, and side wall insulating films $13W_1D$ and $13W_2D$ are formed on opposite side walls of the laminated wiring pattern 13D. Furthermore, silicide layers 13gsC and 13gsD are respectively formed on the topmost layer, i.e., the polysilicon layer 13g of the laminated wiring patterns 13C and 13D.

The laminated wiring patterns 13C and 13D in the area 11C have substantially the same height as that of the stacked gate electrode 13A in the element area 11A, excluding the thickness of the tunnel insulating film 12A.

The stacked gate electrode 13A, the single-layered gate electrode 13B, and the laminated wiring patterns 13C and 13D are formed on the silicon substrate 11 and covered by an interlayer insulating film 14 having a flattened surface. In the element area 11A, via plugs 14cA and 14dA that are respectively electrically connected to the source extension area 11cA and the drain extension area 11dA, are formed in the interlayer insulating film 14. Similarly, in the element area 11B, via plugs 14cB and 14dB that are respectively electrically connected to the source extension area 11cB and the drain extension area 11dB, are formed in the interlayer insulating film 14.

On the interlayer insulating film 14, there is formed a multilayer wiring structure 18 including interlayer insulating films 15, 16, and 17. The interlayer insulating film 15 includes plural wiring patterns 15A forming wiring layers in the element area 11A. The wiring patterns 15A are formed in the interlayer insulating film 15 via barrier metal films 15a, by a damascene process or a dual damascene process. Similarly, in the element area 11B, plural wiring patterns 15B are formed in the interlayer insulating film 15 via barrier metal films 15b, by a damascene process or a dual damascene process. The wiring patterns 15A are electrically connected to the source extension area 11cA via the via plugs 14cA, or electrically connected to the drain extension area 11dA via the via plugs 14dA. The wiring patterns 15B are electrically connected to the source extension area 11cB via the via plugs 14cB, or electrically connected to the drain extension area 11dB via the via plugs 14dB.

The interlayer insulating film 16 includes plural wiring patterns 16A (although only one wiring pattern 16A is illustrated in FIG. 1) in the element area 11A. The wiring patterns 16A are formed in the interlayer insulating film 16 via barrier metal films 16a. The interlayer insulating film 16 includes plural wiring patterns 16B in the element area 11B. The wiring patterns 16B are formed in the interlayer insulating film 16 via barrier metal films 16b. The interlayer insulating film 17 includes plural wiring patterns 17A in the element area 11A. The wiring patterns 17A are formed in the interlayer insulating film 17 via barrier metal films 17a. The interlayer insulating film 17 includes plural wiring patterns 17B in the element area 11B. The wiring patterns 17B are formed in the interlayer insulating film 17 via barrier metal films 17b.

Meanwhile, the interlayer insulating film 15 includes wiring patterns $15C_1$ and $15C_2$ extending in parallel to the laminated wiring patterns 13C and 13D, in the area 11C. The wiring patterns $15C_1$ and $15C_2$ are repeatedly formed alternately in the interlayer insulating film 15 via barrier metal films 15c, by a damascene process, for example. Each of the wiring patterns $15C_1$ is located immediately above the laminated wiring pattern 13C or 13D.

The interlayer insulating film 16 includes wiring patterns $16C_1$ and $16C_2$ extending in parallel to the wiring patterns $15C_1$ and $15C_2$, in the area 11C. The wiring patterns $16C_1$ and $16C_2$ are repeatedly formed alternately in the interlayer insulating film 16 via barrier metal films 16c, by a damascene process, for example. Each wiring pattern $16C_2$ is located immediately above one of the wiring patterns $15C_1$, and each wiring pattern $16C_1$ is located immediately above one of the wiring patterns $15C_2$.

The interlayer insulating film 17 includes wiring patterns $17C_1$ and $17C_2$ extending in parallel to the wiring patterns $16C_1$ and $16C_2$, in the area 11C. The wiring patterns $17C_1$ and $17C_2$ are repeatedly formed alternately in the interlayer insulating film 17 via barrier metal films 17c, by a damascene process, for example. Each wiring pattern $17C_1$ is located immediately above one of the wiring patterns $16C_2$, and each wiring pattern $17C_2$ is located immediately above one of the wiring patterns $16C_1$.

Figure 3:
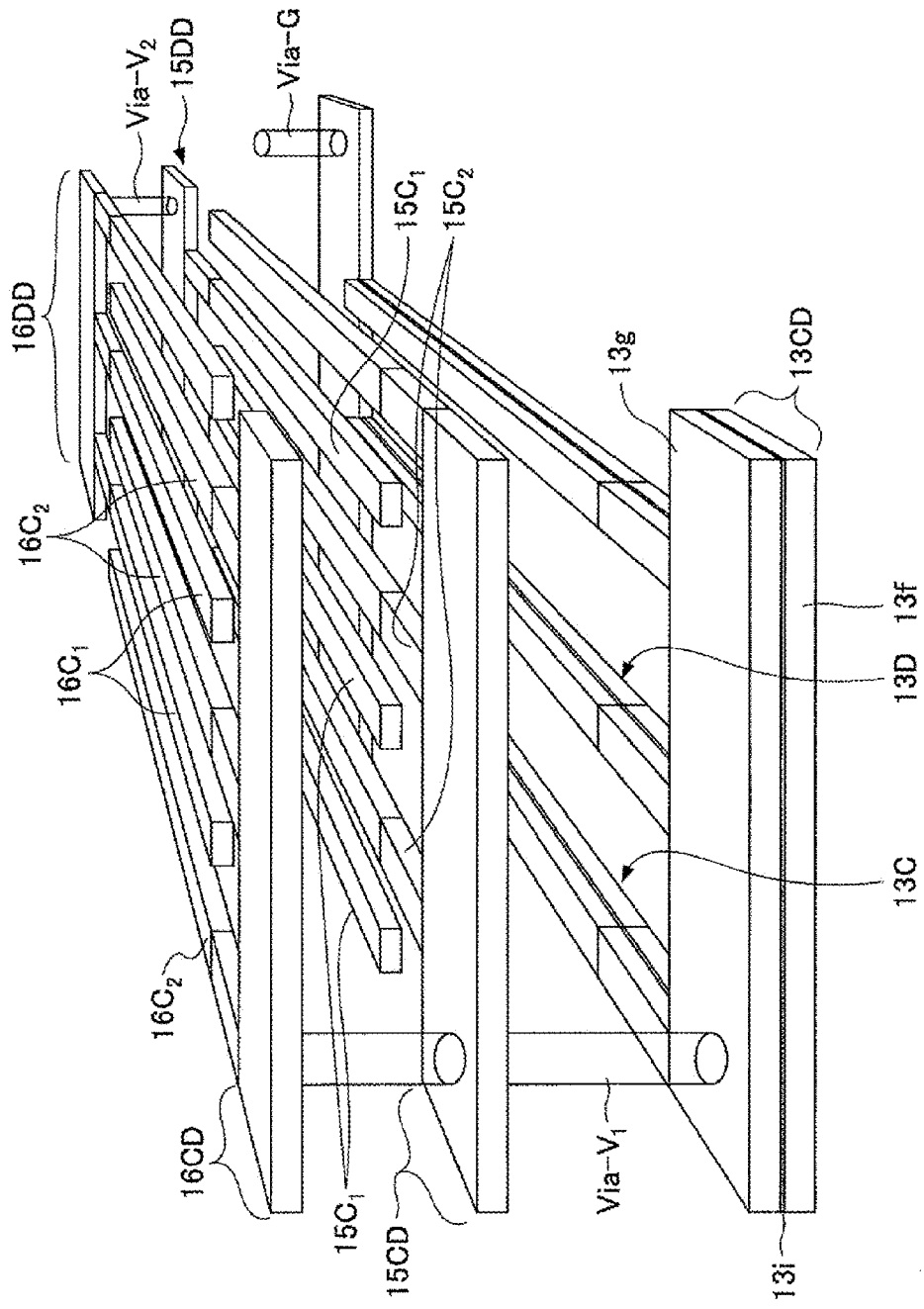
FIG. 3 is a transparent perspective view of a capacitor element in the semiconductor integrated circuit device illustrated in FIG. 1.
Figure 4:
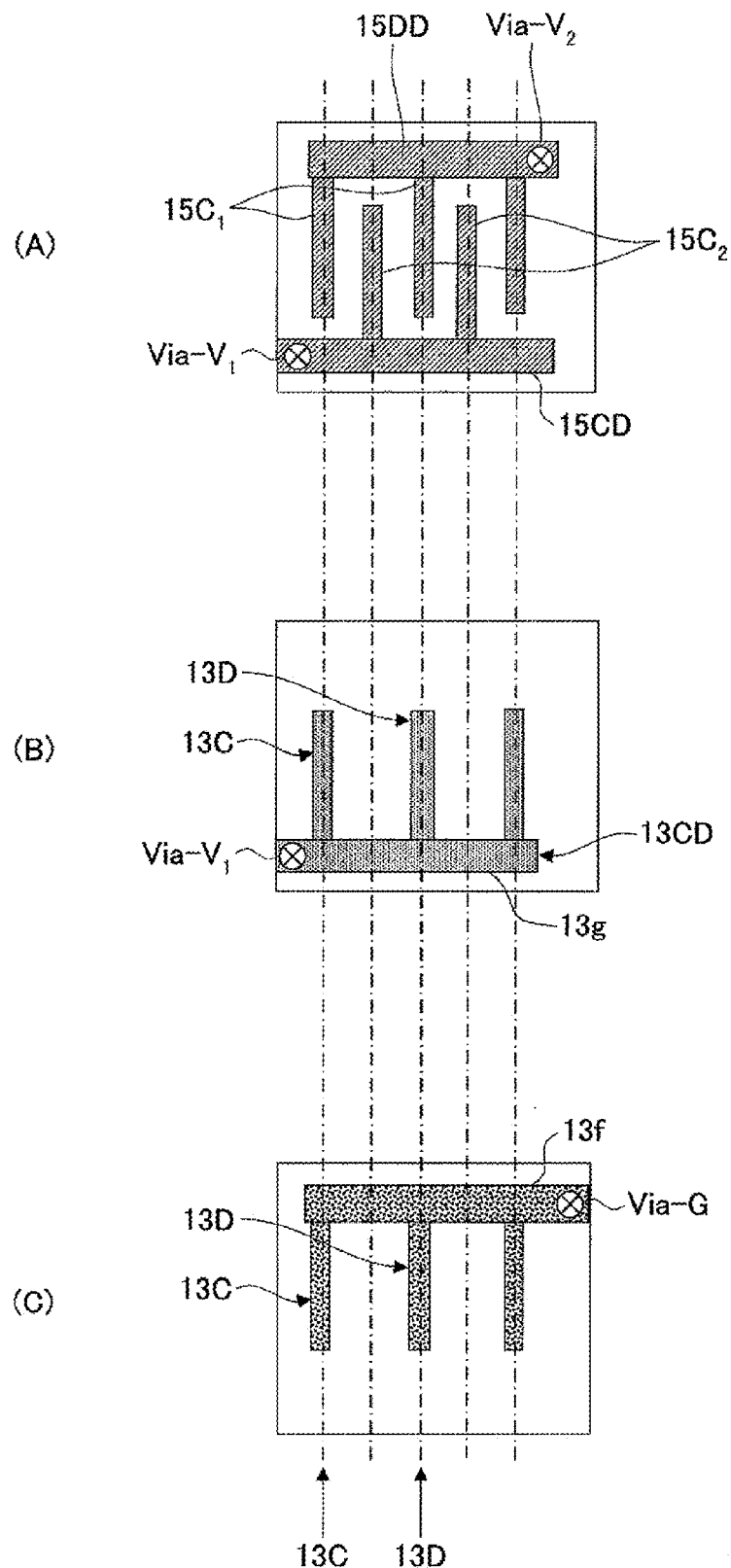
FIG. 4 includes plan views illustrating electrode patterns in the semiconductor integrated circuit device illustrated in FIG. 1.

FIG. 3 is a transparent perspective view of a comb-tooth type capacitor element having a multilayer wiring structure including the laminated wiring patterns 13C and 13D in the area 11C. FIG. 4 includes plan views illustrating the shapes of the polysilicon layers 13f and 13g, and the wiring patterns $15C_1$ and $15C_2$.

Referring to FIGS. 3 and 4, the laminated wiring patterns 13C and 13D extend in parallel from a common wiring base part 13CD, thus forming comb-tooth shapes. Similarly, the polysilicon layers 13f and 13g, the wiring patterns $15C_1$ and $15C_2$, the wiring patterns $16C_1$ and $16C_2$, and the wiring patterns $17C_1$ and $17C_2$ (not illustrated in FIG. 3) have comb-tooth shapes corresponding to the laminated wiring patterns 13C and 13D. The wiring patterns $15C_2$ are extending in parallel to each other from a common wiring base part 15CD. The wiring patterns $16C_2$ are extending in parallel to each other from a common wiring base part 16CD. The wiring patterns $15C_1$ are extending in parallel to each other from a common wiring base part 15DD. The wiring patterns $16C_1$ are extending in parallel to each other from a common wiring base part 16DD. Although not illustrated, the wiring patterns $17C_1$ and $17C_2$ are also configured in the same manner as above.

The polysilicon layer 13f is connected to ground at a via contact Via-G. Therefore, the polysilicon layer 13g above the polysilicon layer 13f and the silicide layers 13gsC and 13gsD are electrostatically shielded. Meanwhile, the polysilicon layer 13g and the wiring pattern $15C_2$ are supplied with a voltage $V_1$ by a via contact Via-$V_1$, and the wiring pattern $15C_1$ is supplied with a voltage $V_2$ that is different from the voltage $V_1$, by a via contact Via-$V_2$.

Similarly, although not illustrated, the wiring pattern $16C_1$ is supplied with the voltage $V_2$, the wiring pattern $16C_2$ is supplied with the voltage $V_1$, the wiring pattern $17C_1$ is supplied with the voltage $V_2$, and the wiring pattern $17C_2$ is supplied with the voltage $V_1$. The via contacts may be formed by, for example, a dual damascene process.

Figure 5:
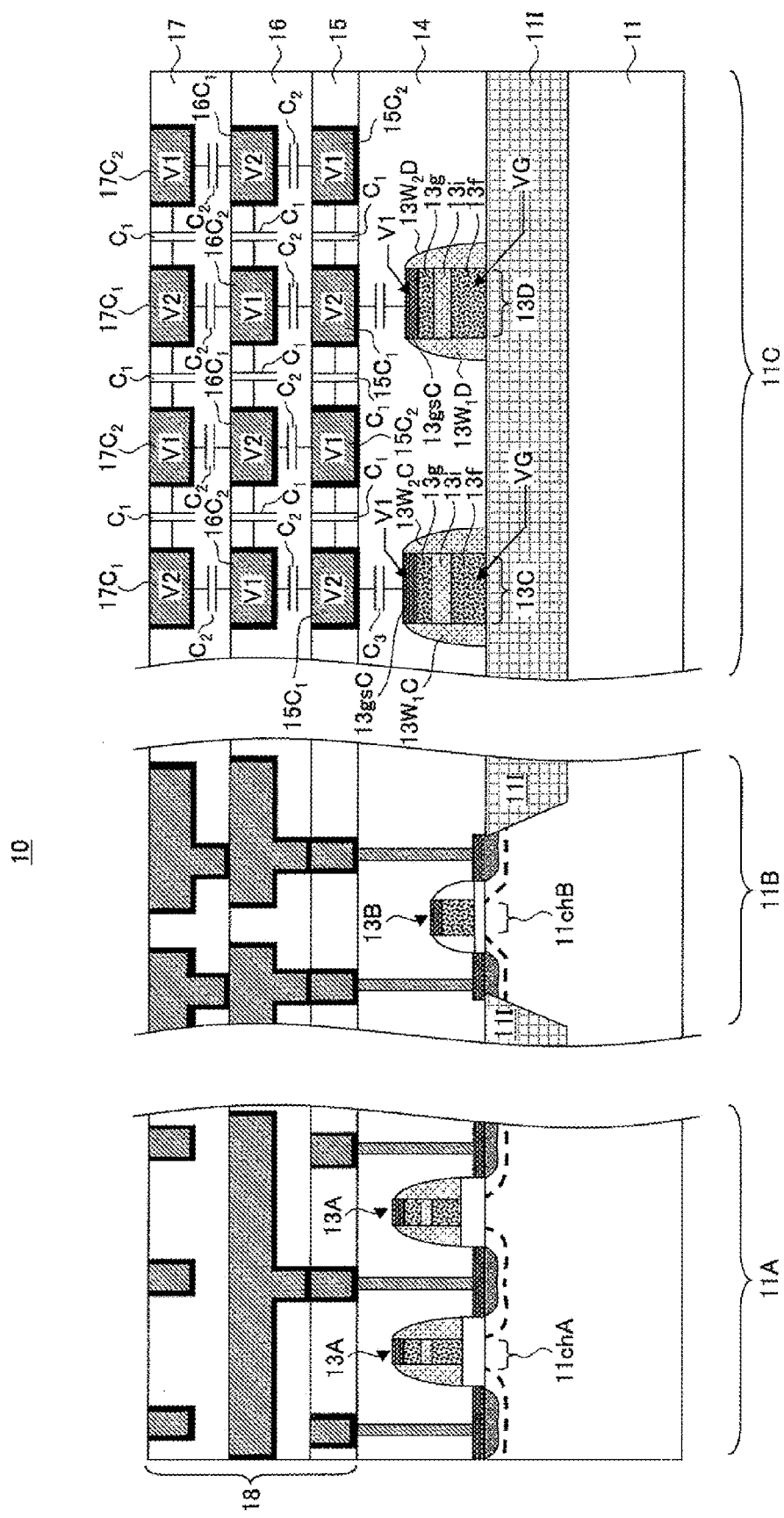
FIG. 5 is for describing an operation of the capacitor element in the semiconductor integrated circuit device illustrated in FIG. 1.

Consequently, as illustrated in FIG. 5, in the multilayer wiring structure 18 in the area 11C, a capacitance $C_1$ is formed between the wiring patterns $15C_1$ and $15C_2$ in the interlayer insulating film 15; the capacitance $C_1$ is formed between the wiring patterns $16C_1$ and $16C_2$ in the interlayer insulating film 16; and the capacitance $C_1$ is formed between the wiring patterns $17C_1$ and $17C_2$ in the interlayer insulating film 17. Furthermore, a capacitance $C_2$ is formed between wiring patterns that are vertically adjacent to each other, i.e., between the wiring patterns $15C_1$ and $16C_2$, between the wiring patterns $15C_2$ and $16C_1$, between the wiring patterns $16C_1$ and $17C_2$, and between the wiring patterns $16C_2$ and $17C_1$. Furthermore, in the embodiment illustrated in FIG. 5, the wiring patterns 13C and 13D have substantially the same height as the stacked gate electrode 13A. Therefore, a capacitance $C_3$ is formed between the silicide layer 13gsC of the wiring pattern 13C and the vertically adjacent wiring pattern $15C_1$ located above the silicide layer 13gsC; and the capacitance $C_3$ is formed between the silicide layer 13gsD of the wiring pattern 13D and the vertically adjacent wiring pattern $15C_1$ located above the silicide layer 13gsD.

According to the present embodiment, a capacitor element is formed, in which the capacitances $C_1$, $C_2$, and $C_3$ are effectively connected in parallel.

Figure 6:
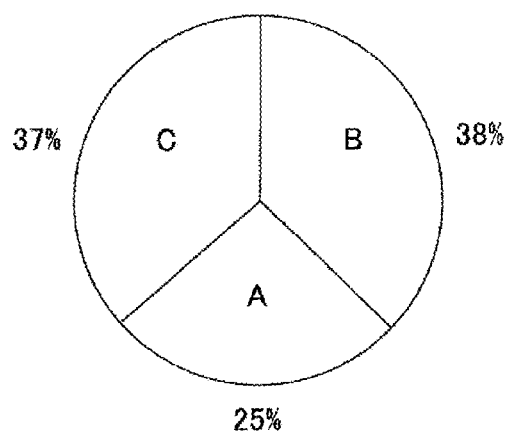
FIG. 6 is a circle graph illustrating contribution ratios of respective capacitors in a model structure of the semiconductor integrated circuit device illustrated in FIG. 7, with respect to the capacitance of the capacitor element.
Figure 7:
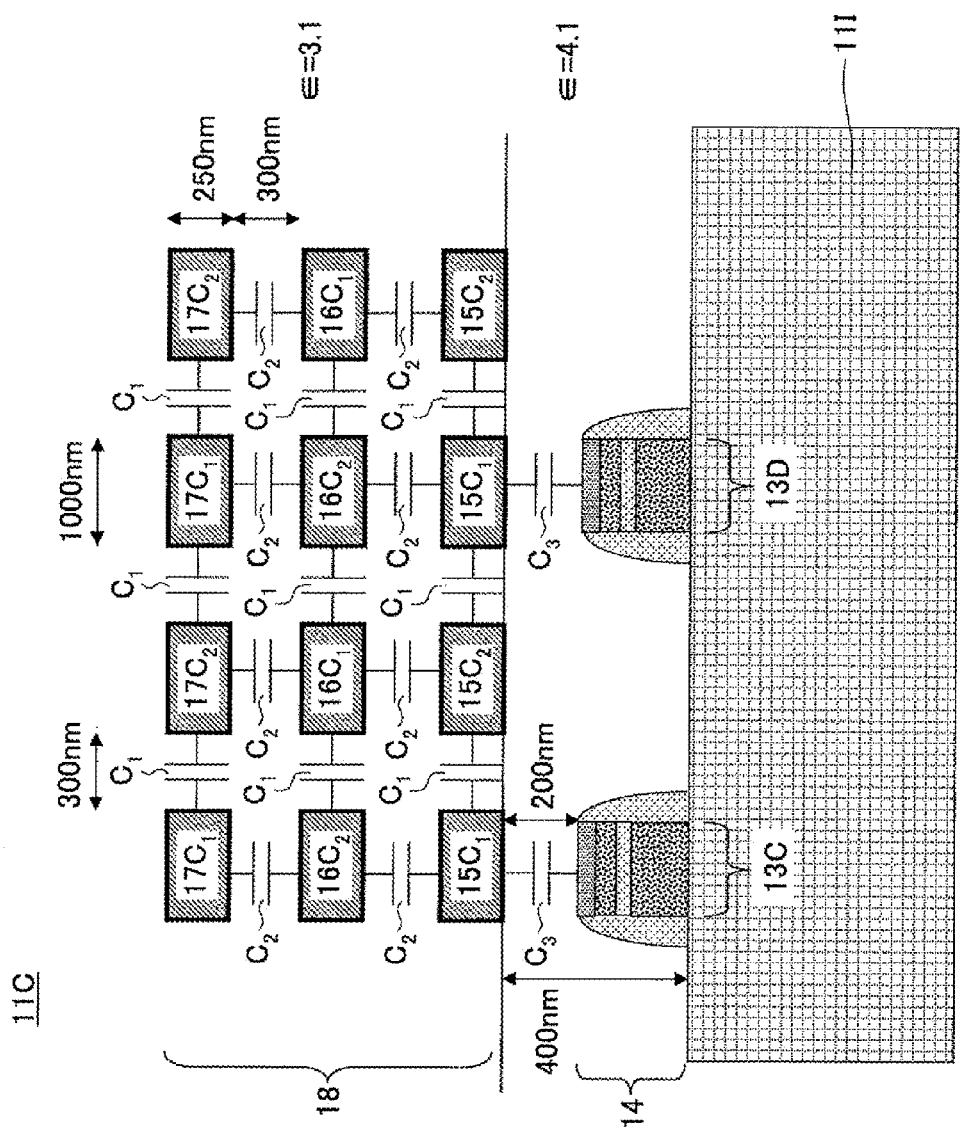
FIG. 7 is a model structure of the capacitor element illustrated in FIG. 1.

FIG. 6 is a graph illustrating the ratio of the capacitances $C_1$, $C_2$, and $C_3$ when parameters indicated in a model structure of FIG. 7 are used in the multilayer wiring structure in the area 11C.

First, referring to FIG. 7, the model structure includes three layers of wiring patterns $15C_1$, $15C_2$, $16C_1$, $16C_2$, $17C_1$, and $17C_2$ in a multilayer wiring structure. As the interlayer insulating film 14, a silicon dioxide film having a relative permittivity of 4.1 and a thickness of 400 nm is used. In the model structure, the distance between the top edge of the laminated wiring pattern 13C or 13D and the flattened surface of the interlayer insulating film 14 is 200 nm. Furthermore, in the model structure, each of the wiring patterns $15C_1$, $15C_2$, $16C_1$, $16C_2$, $17C_1$, and $17C_2$ have a width of 1000 nm and a thickness of 250 nm. Intervals between adjacent wiring patterns in the same interlayer insulating film are 300 nm, and intervals between vertically adjacent wiring patterns are 300 nm. The interlayer insulating films 15, 16, and 17 have a relative permittivity of 3.1.

Referring to FIG. 6, in the model structure, the contribution ratio A of the capacitance $C_1$ is 25%, the contribution ratio B of the capacitance $C_2$ is 38%, and the contribution ratio C of the capacitance $C_3$ is 37%. This means that when forming a capacitor element in the area 11C, according to the contribution ratio C of the capacitance $C_3$, it is possible to reduce the area of the area 11C by 37%.

In the present embodiment, in the capacitor element formed in the area 11C as described above, the capacitance $C_3$ is formed between the wiring pattern $15C_1$ and the silicide layer 13gsC or 13gsD that is the topmost layer of the laminated wiring pattern 13C or 13D. Therefore, even though polysilicon, which is a semiconductor, is used as the laminated wiring patterns 13C and 13D, the value of the capacitance $C_3$ does not change according to the values of the voltages $V_1$ and $V_2$. Accordingly, the capacitor element has excellent qualities.

Figure 8:
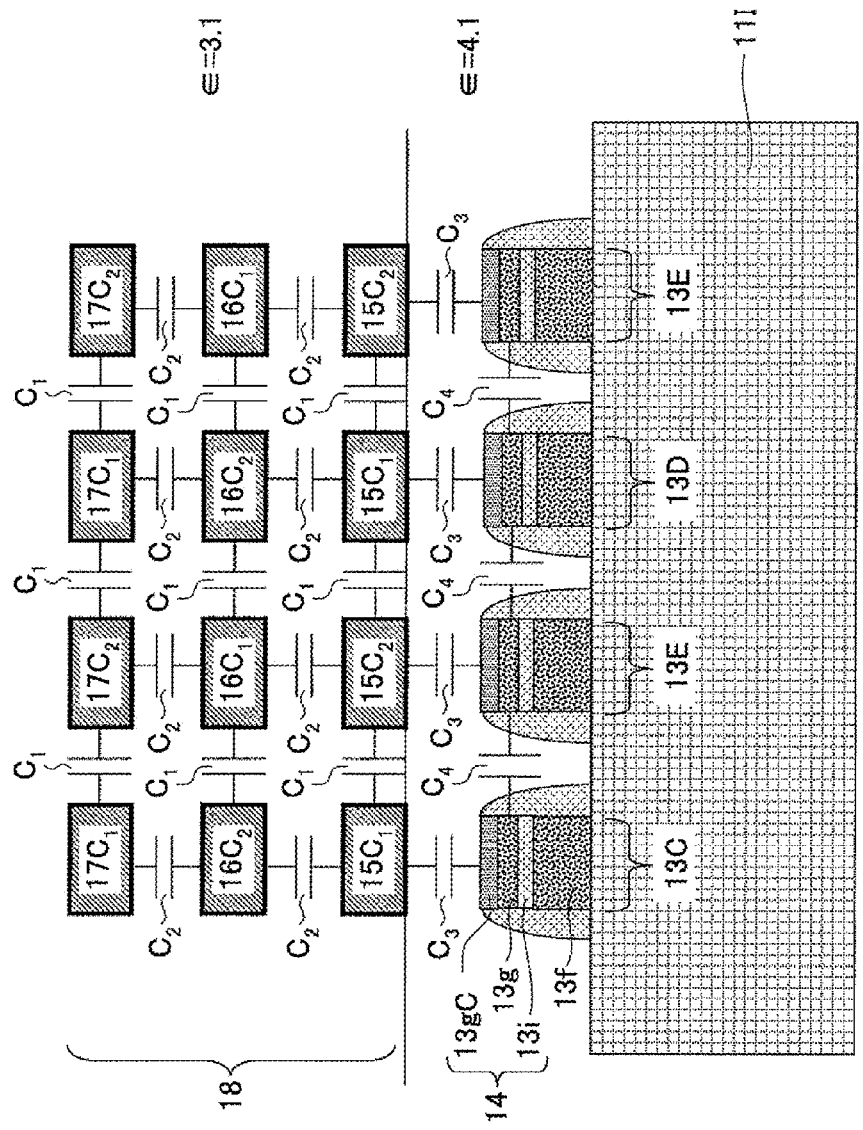
FIG. 8 illustrates a modification of the capacitor element according to the first embodiment.

As illustrated in FIG. 8, it is assumed that another laminated wiring pattern 13E is provided between the laminated wiring patterns 13C and 13D in the area 11C, and the voltage $V_2$ is supplied to the polysilicon layer 13g. In this case, as illustrated in FIG. 8, an additional capacitance $C_3$ is generated between the laminated wiring pattern 13E and the wiring pattern $15C_2$ immediately above the laminated wiring pattern 13E. Furthermore, an additional capacitance $C_4$ is generated between the laminated wiring pattern 13E and the laminated wiring patterns 13C and 13D adjacent to the left and right sides of the laminated wiring pattern 13E.

Such a configuration has preferable effects in terms of increasing the capacitance; however, as a voltage is applied in the polysilicon layer 13g, a depleted layer may be generated at the interface between the polysilicon layer 13g and the insulating layer 13i. The thickness of such a depleted layer typically changes by applying a voltage. Therefore, the value of the capacitance $C_4$ is affected by the capacitance of the depleted layer, and may change according to the voltages $V_1$ and $V_2$ applied to the laminated wiring patterns 13C through 13E.

Conversely, the configuration illustrated in FIG. 7 does not include the capacitance $C_4$ that changes according to the applied voltage, and therefore the capacitance of the capacitor element formed in the area 11 is fixed with high precision.

Figure 9:
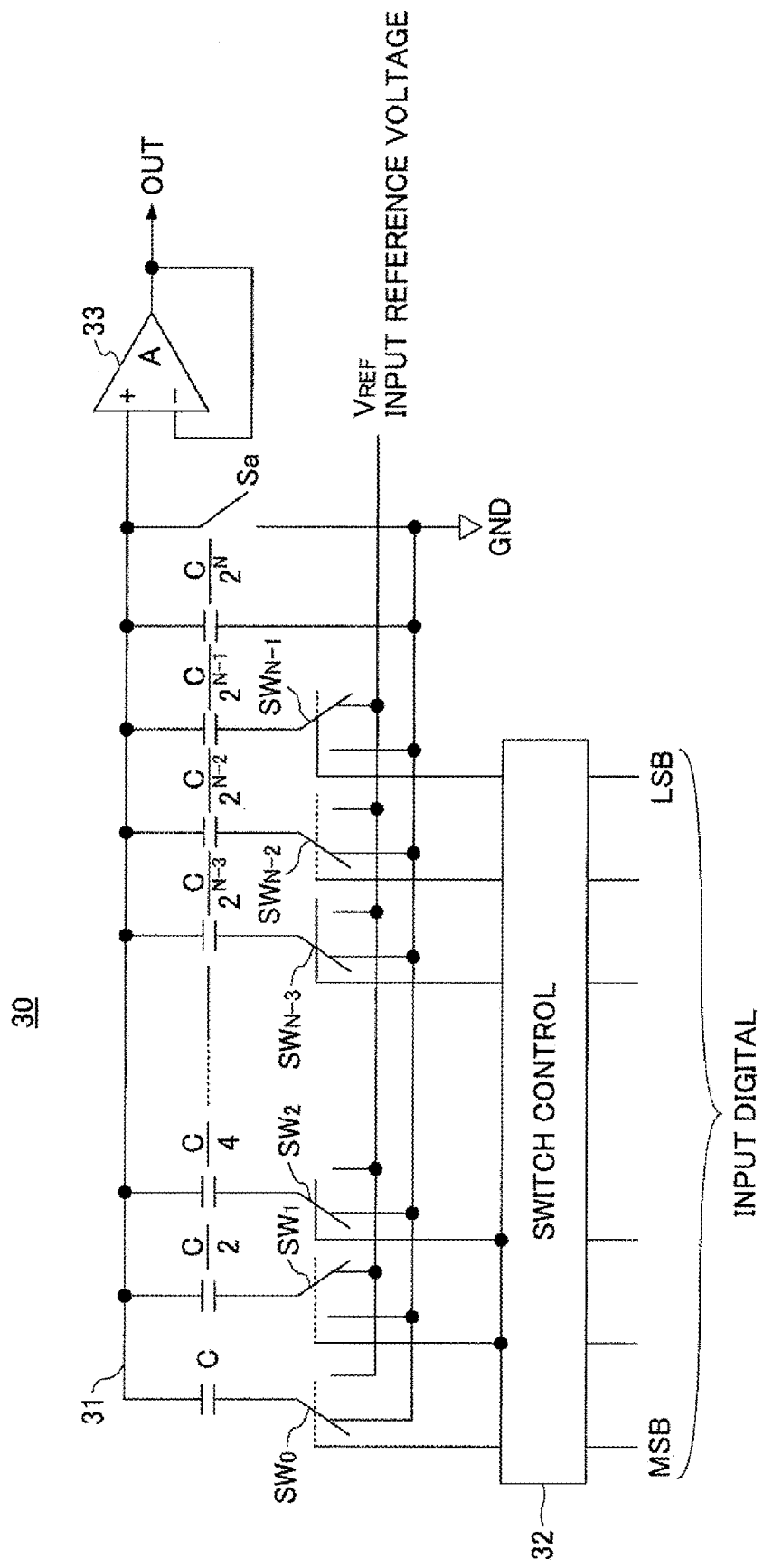
FIG. 9 is a circuit diagram of an application example of the capacitor element in the semiconductor integrated circuit device illustrated in FIG. 1.

FIG. 9 illustrates the configuration of a D/A converter 30, as an example of a circuit that is demanded to have a highly precise capacitance.

Referring to FIG. 9, the D/A converter 30 includes multiple capacitors respectively having capacitances of C, C/2, C/4 ... $C/2^{N-3}$, $C/2^{N-2}$, $C/2^{N-1}$, $C/2^N$, which are connected to a common line 31. The capacitors are connected to ground or to a reference voltage $V_{ref}$, by their respective switches $SW_0$, $SW_1$, $SW_2$ ... $SW_{N-3}$, $SW_{N-2}$, $SW_{N-1}$.

The switches $SW_0$, $SW_1$, $SW_2$ ... $SW_{N-3}$, $SW_{N-2}$, $SW_{N-1}$ are controlled by a switch controller 32 that is supplied with digital signals including a minimum bit (LSB) and a maximum bit (MSB). A switch that is specified by a digital signal connects a corresponding capacitor to the reference voltage source, while other switches connect corresponding capacitors to ground. In the example of FIG. 9, the switch $SW_2$ and the switch $SW_{N-1}$ are connecting corresponding capacitors to the reference voltage source.

In the D/A converter 30, the line 31 obtains a voltage that is obtained by dividing the reference voltage $V_{ref}$ by a ratio $Cset/(Cset+C_b)$, where Cset is a capacitance of a capacitor connected to the reference voltage source $V_{ref}$, and $C_b$ is a capacitance of a capacitor connected to ground. The obtained voltage is amplified by an amplifier 33, and is then output as an analog signal.

In a circuit or device in which the voltage is divided by a capacitance ratio, the capacitance is preferably highly precise. In this respect, the capacitor element formed in the area 11C of the present embodiment is preferable for such a purpose.

In the capacitor element illustrated in FIG. 8, the capacitance changes according to the voltages $V_1$ and $V_2$. However, the capacitance is increased compared to that of the configuration illustrated in FIG. 7. Therefore, the capacitor element of FIG. 8 is effective for applications in which the capacitance does not need to be highly precise. Thus, the configuration of FIG. 8 is a modification of the present embodiment.

A manufacturing method of the semiconductor integrated circuit device 10 illustrated in FIG. 1 is described with reference to FIGS. 10A through 10S.

Figure 10A:
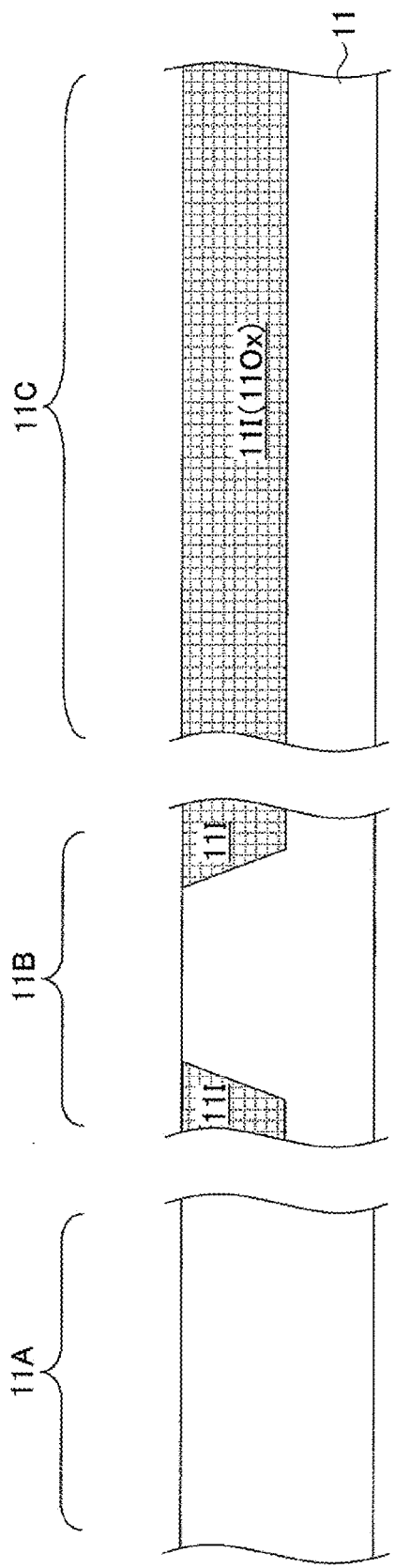
FIG. 10A illustrates a manufacturing method of the semiconductor integrated circuit device illustrated in FIG. 1 (part 1)

Referring to FIG. 10A, the element areas 11A and 11B and the area 11C (i.e., the area other than the element areas 11A and 11B) are formed on the silicon substrate 11 by being defined by an STI type element separating area 11I. The element area 11A is for a flash memory, and the element area 11B is for a high-speed logic transistor. The area 11C is covered by a silicon dioxide film 11Ox configuring the element separating area 11I. In the step of FIG. 10A, in the element area 11A, a p type well is formed in such a manner as to be surrounded by an n type well (not illustrated). In the element area 11B, when the high-speed logic transistor to be formed is an n channel MOS transistor, a p type well is formed. Conversely, in the element area 11B, when the high-speed logic transistor to be formed is a p channel MOS transistor, an n type well is formed. In the state of FIG. 10A, in the element area 11A, ions are implanted for controlling the threshold of the flash memory cell transistor (not illustrated).

Figure 10B:
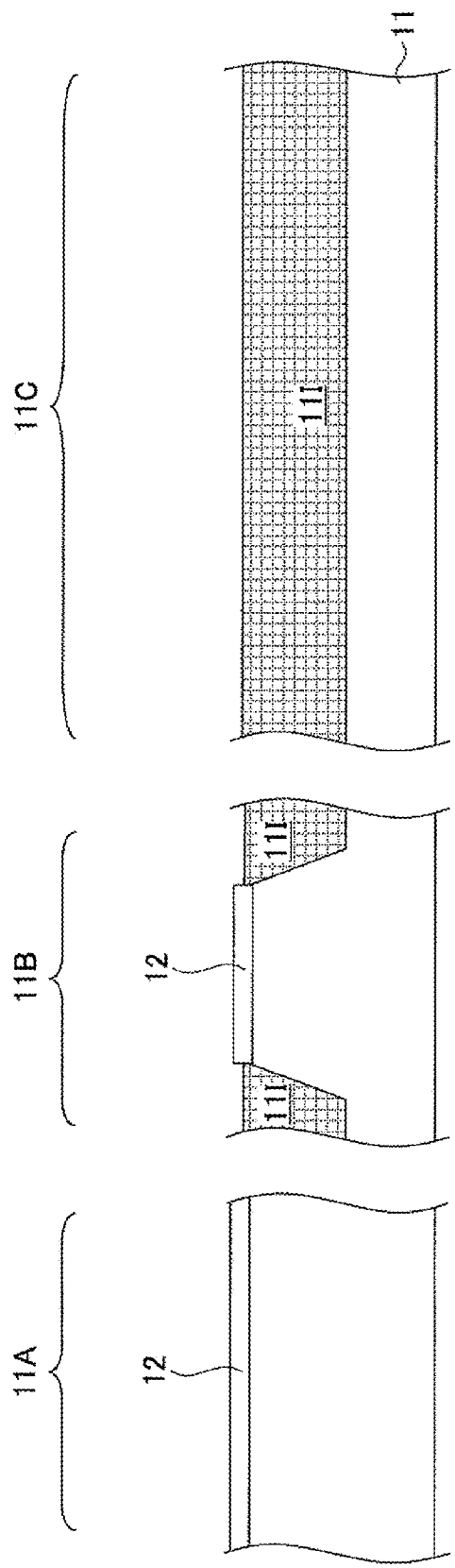
FIG. 10B illustrates the manufacturing method of the semiconductor integrated circuit device illustrated in FIG. 1 (part 2)

Next, in the step of FIG. 10B, after cleaning the structure of FIG. 10A with HF, the exposed silicon surface is subjected to thermal oxidation. In the element areas 11A and 11B, a thermally-oxidized film 12 having a thickness of, for example, 10 nm is formed.

Figure 10C:
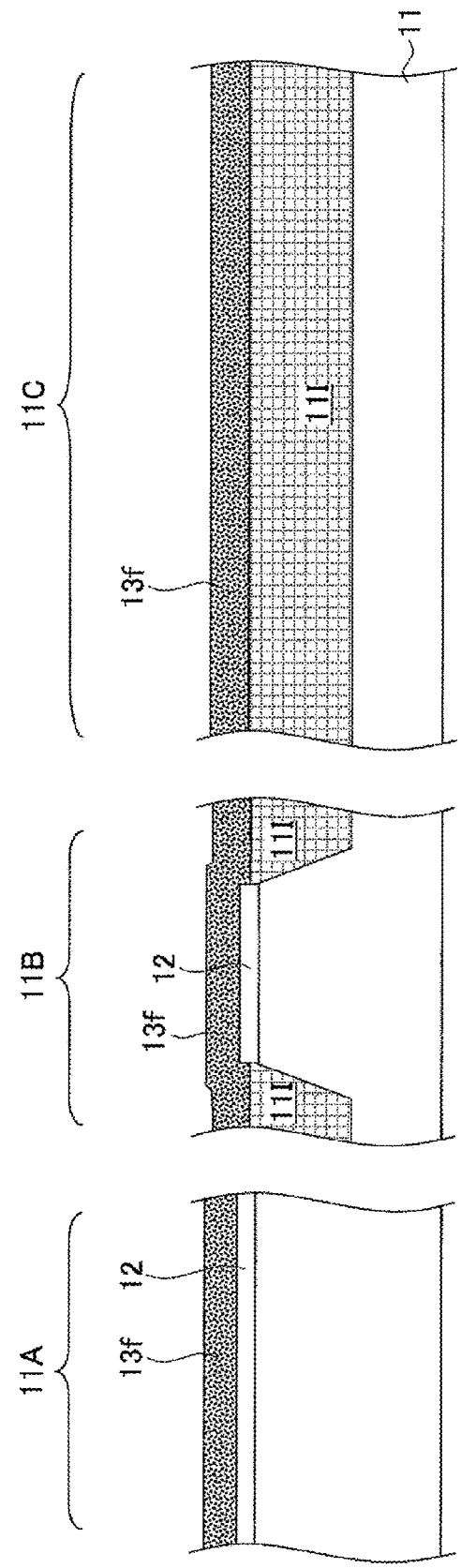
FIG. 10C illustrates the manufacturing method of the semiconductor integrated circuit device illustrated in FIG. 1 (part 3)

Then, in the step of FIG. 10C, an amorphous silicon film that is doped with P (phosphorus) by a density of $1 \times 10^{20}$ cm$^{-3}$ is formed on the structure of FIG. 10B by a vacuum CVD method. The amorphous silicon film is formed to have a thickness of, for example, 90 nm, at a position corresponding to the polysilicon layer 13f. It is to be noted that the doping density of $1 \times 10^{20}$ cm$^{-3}$ is a density appropriate for saving data in the flash memory. If the doping density is higher than this density, the data saving performance is degraded, and the reliability of the flash memory is reduced.

Then, in the step of FIG. 10D, the amorphous silicon film for forming the polysilicon layer 13f is subjected to patterning, and removed from the element area 11B.

Next, in the step of FIG. 10E, an ONO film is formed on the structure of FIG. 10D, at a position corresponding to the inter-electrode insulating layer 13i. In FIG. 10E, the ONO film is denoted by the reference numeral 13i. The ONO film corresponding to the inter-electrode insulating layer 13i is formed by laminated layers of a silicon dioxide film formed to have a thickness of 5 nm through 10 nm by a CVD method, a SiN film formed to have a thickness of 3 nm through 10 nm by a CVD method, and a thermally-oxidized film formed by thermally-oxidizing the surface of the SiN film. In the state of FIG. 10E, it is possible to implant ions in the element area 11B via the ONO film 13i as formed above, for controlling the threshold of the high-speed logic transistor to be formed in the element area 11B.

Next, in the step of FIG. 10F, the element area 11A and the area 11C are covered by a resist pattern (not illustrated), and the ONO film 13i and the thermally-oxidized film 12 are selectively removed from the element area 11B. The ONO film 13i is removed by dry-etching, and the thermally-oxidized film 12 is removed by wet-etching with the use of an HF solution. As a result of this patterning process, a thermally-oxidized film pattern 12A is formed in the element area 11A.

Next, in the step of FIG. 10G, a thermal oxidation process is performed on the structure of FIG. 10F after removing the resist pattern. Accordingly, a gate dioxide film 12B having a thickness of approximately 2 nm is formed on the exposed silicon surface in the element area 11B. The thickness is set to 2 nm in consideration of a transistor having a gate length of 90 nm.

Next, in the step of FIG. 10H, a polysilicon film forming the polysilicon layer 13g is formed by a CVD method on the structure of FIG. 10G to have a thickness of, for example, 100 nm. The amorphous silicon film corresponding to the polysilicon layer 13f would have been recrystallized and turned into polysilicon by this time point, and is thus referred to the polysilicon layer 13f hereafter.

Figure 10I:
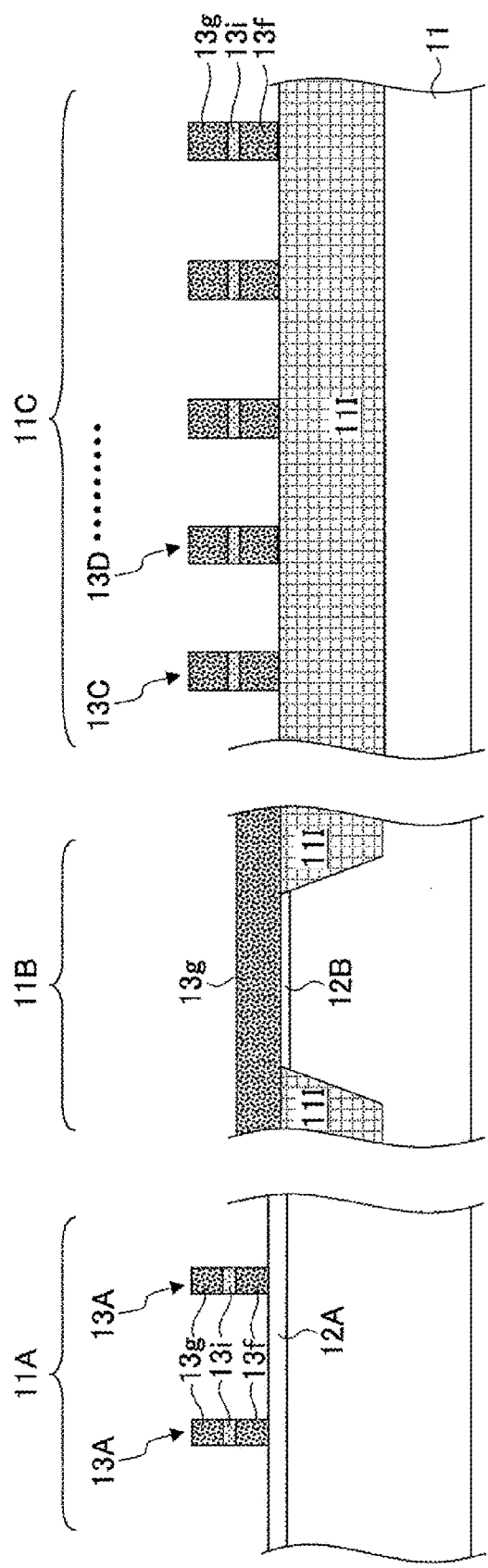
FIG. 10I illustrates the manufacturing method of the semiconductor integrated circuit device illustrated in FIG. 1 (part 9)

Then, in the step of FIG. 10I, patterning is performed on the laminated layer structure including the polysilicon layer 13f, the ONO layer 13i, and the polysilicon layer 13g, which are formed in the element area 11A and the area 11C. Accordingly, in the element area 11A, the stacked gate electrodes 13A are formed into line-and-space patterns having a width of W1. In the area 11C, the laminated wiring patterns 13C, 13D . . . are formed into line-and-space patterns having a width of W2.

Figure 10J:
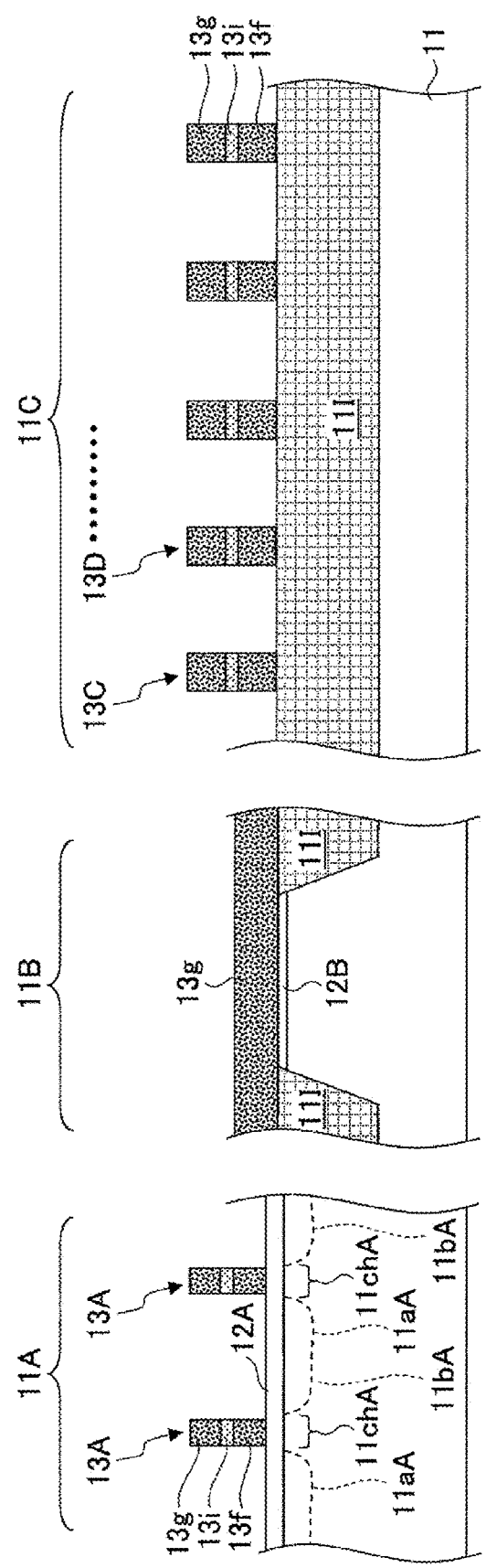
FIG. 10J illustrates the manufacturing method of the semiconductor integrated circuit device illustrated in FIG. 1 (part 10)

Next, in the step of FIG. 10J, the element area 11B and the area 11C are covered by a resist pattern. In the element area 11A, As (arsenic) ions (As+) are implanted using the stacked gate electrodes 13A as masks, with an accelerating voltage of 30 keV through 80 keV and by a dose amount of $1 \times 10^{14}$ cm$^{-2}$ through $5 \times 10^{14}$ cm$^{-2}$. In the silicon substrate 11, n type LDD areas 11aA and 11bA that are facing each other across the channel area 11ChA that is immediately below the stacked gate electrode 13A. The stacked gate electrode 13A is repeatedly formed in the element area 11A, and therefore the LDD area 11bA formed for one stacked gate electrode 13A is connected to the LDD area 11aA of an adjacent stacked gate electrode 13A.

Furthermore, in the step of FIG. 10J, although not illustrated, the following process is preferably performed after the step of implanting ions, for the purpose of enhancing the reliability of the flash memory. Specifically, the structure of FIG. 10J is subjected to a thermal oxidation process, and thermally-oxidized films are formed on the side walls of the floating gate electrodes formed by the polysilicon layers 13*f* in the stacked gate electrodes 13A.

Next, in the step of FIG. 10K, a silicon nitride film is formed on the structure of FIG. 10J by a CVD method to have a thickness of, for example, 80 nm, in a manner as to match the base pattern. Furthermore, this silicon nitride film is subjected to dry etching in a direction substantially perpendicular to the main surface of the silicon substrate 11, so that the silicon nitride film is etched back until the surface of the silicon substrate 11 is exposed. Accordingly, the side wall insulating films 13W$_1$A and 13W$_2$A are formed on the side walls of the stacked gate electrode 13A. At the same time, in the area 11C, the side wall insulating films 13W$_1$C and 13W$_2$C are similarly formed on the side walls of the laminated wiring patterns 13C, 13D . . . .

Figure 10L:
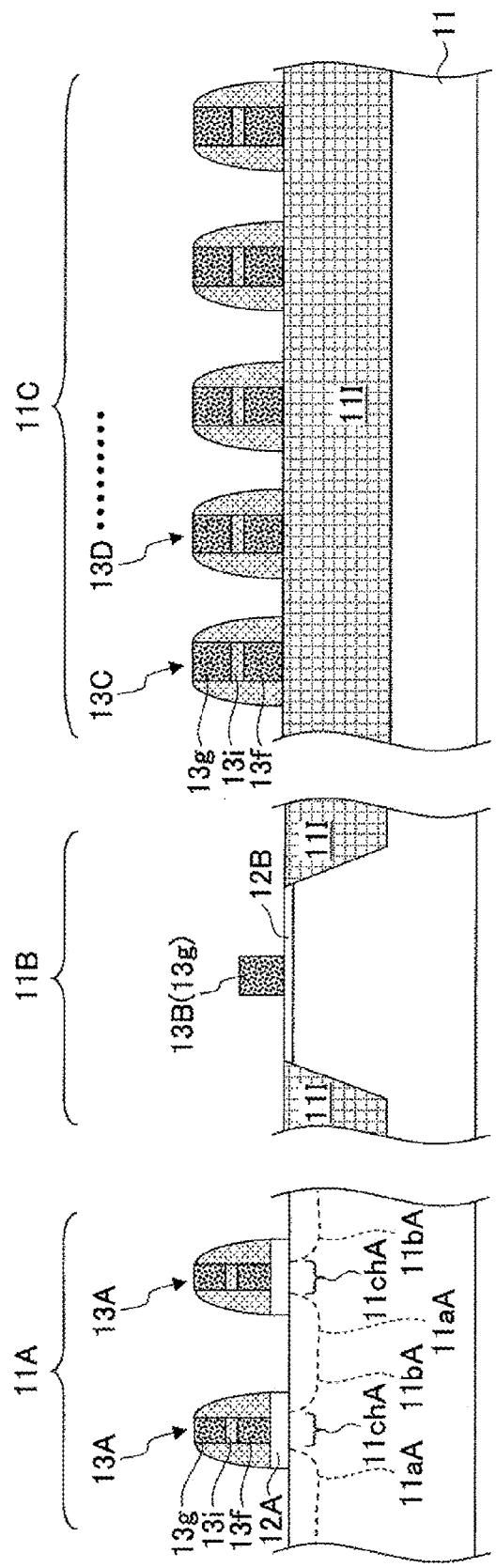
FIG. 10L illustrates the manufacturing method of the semiconductor integrated circuit device illustrated in FIG. 1 (part 12)
Figure 10M:
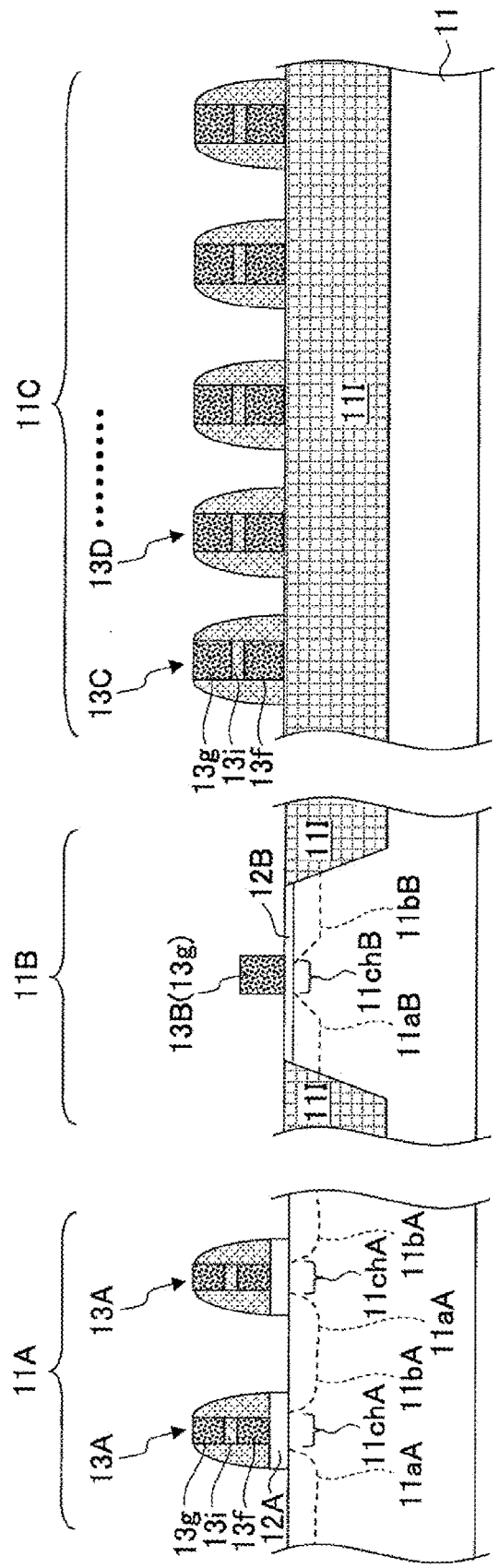
FIG. 10M illustrates the manufacturing method of the semiconductor integrated circuit device illustrated in FIG. 1 (part 13)

Next, in the step of FIG. 10L, in the element area 11B, the polysilicon pattern is patterned into the single-layered gate electrode 13B. In the step of FIG. 10M, while the element area 11A and the area 11C are protected by a resist pattern, n type impurity elements such as As and P, or p type impurity elements such as B (boron) are injected into the element area 11B by ion implantation using the single-layered gate electrode 13B as a mask. Accordingly, in the silicon substrate 11, n type or p type LDD areas 11*a*B and 11*b*B are formed in such a manner as to face each other across the channel area 11ChB that is immediately below the stacked gate electrode 13B. In the step of FIG. 10M, in the element area 11B, ions may be implanted from an oblique direction to perform pocket implantation. Specifically, when the LDD areas 11*a*B and 11*b*B are n types, p type impurity elements are implanted. When the LDD areas 11*a*B and 11*b*B are p types, n type impurity elements are implanted.

Figure 10N:
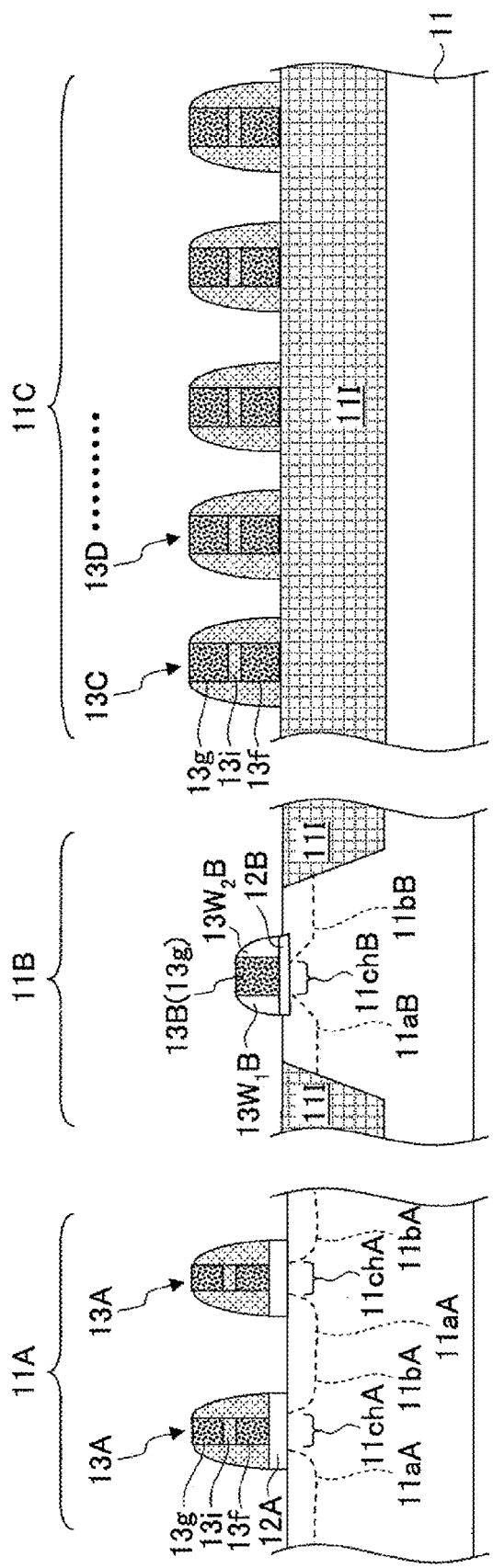
FIG. 10N illustrates the manufacturing method of the semiconductor integrated circuit device illustrated in FIG. 1 (part 14)
Figure 100:
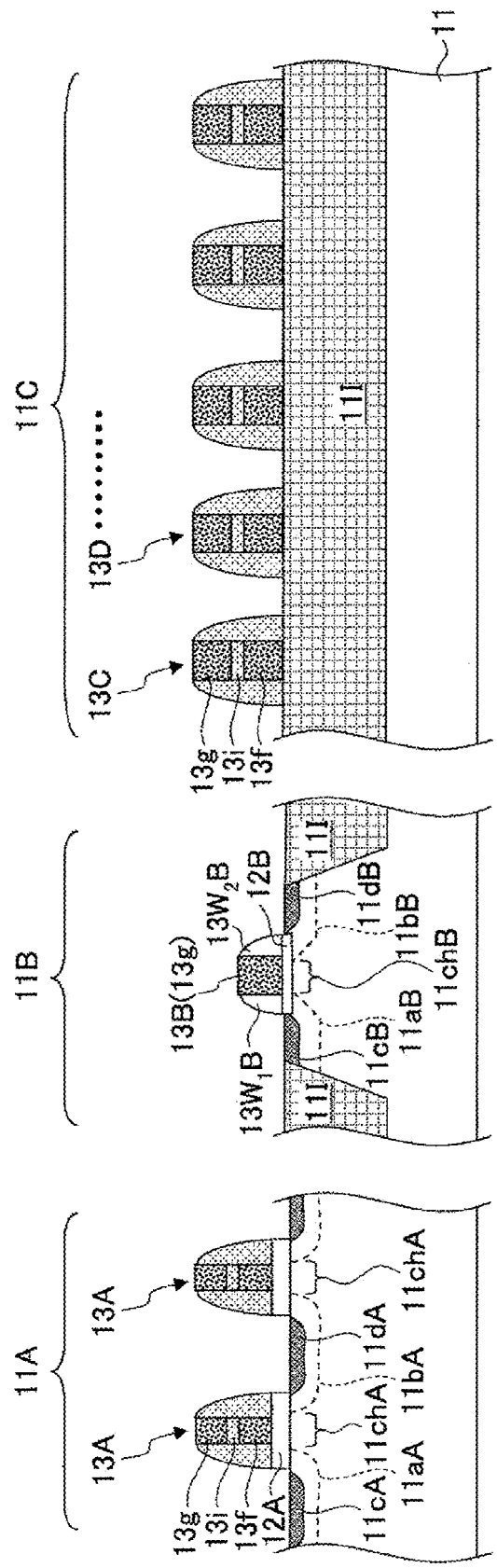

Then, in the step of FIG. 10N, after the resist pattern is removed from the element area 11A and the area 11C, a silicon dioxide film is formed on the structure of FIG. 10M by a CVD method to have a thickness of, for example, 100 nm, in a manner as to match the base pattern. Furthermore, this silicon dioxide film is subjected to dry etching in a direction substantially perpendicular to the main surface of the silicon substrate 11, so that the silicon dioxide film is etched. Accordingly, the side wall insulating films 13W$_1$B and 13W$_2$B are formed on the side walls of the single-layered gate electrode 13B.

Then, in the step of FIG. 10O, when the high-speed logic transistor formed in the element area 11B is an n channel MOS transistor, As ions are implanted in the element areas 11A and 11B and the area 11C, with an accelerating voltage of 5 keV and by a dose amount of $1\times10^{15}$ cm$^{-2}$. In the element area 11A, the source extension area 11*c*A and the drain extension area 11*d*A are formed by doping the following areas to an n+ type. Specifically, in the silicon substrate 11, the areas outside the side wall insulating films 13W$_1$A and 13W$_2$A as viewed from the channel area 11ChA of the stacked gate electrode 13A are doped to an n+ type. Furthermore, in this step, the polysilicon layer 13*g* is also doped to an n+ type. The polysilicon layer 13*g* forms a control electrode in the stacked gate electrode 13A, and forms the single-layered gate electrode 13B in the element area 11B, and part of the laminated wiring patterns 13C and 13D in the area 11C.

When the high-speed logic transistor formed in the element area 11B is a p channel MOS transistor, in the step of FIG. 10O, the element area 11B is protected by a resist pattern while ions are implanted into the element area 11A and the area 11C. Furthermore, in a state where the element area 11A and the area 11C are protected by a resist pattern, p type impurity elements such as B are ion-implanted into the silicon substrate 11.

Accordingly, in the silicon substrate 11, areas on the outside of the side wall insulating films 13W$_1$B and 13W$_2$B as viewed from the channel area 11ChB immediately below the single-layered gate electrode 13B are doped to a p+ type, so that the source extension area 11*c*B and the drain extension area 11*d*B are formed as p+ type extension areas.

Figure 10P:
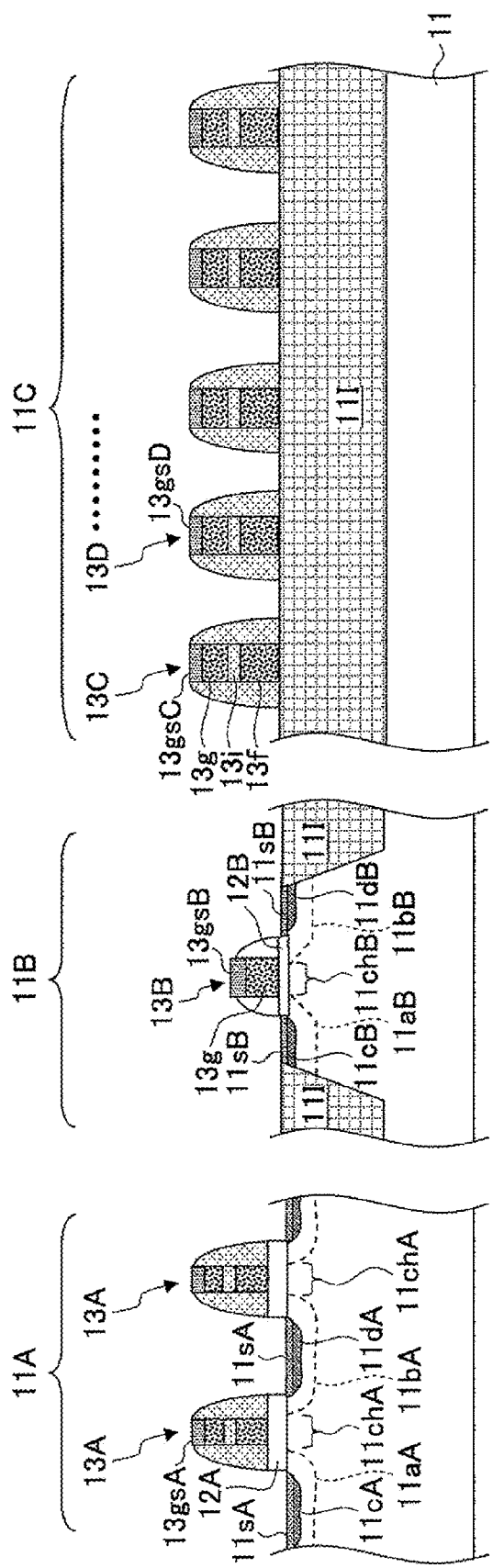
FIG. 10P illustrates the manufacturing method of the semiconductor integrated circuit device illustrated in FIG. 1 (part 16)

Then, in the step of FIG. 10P, on the structure of FIG. 10O, for example, a cobalt (Co) film having a thickness of approximately 10 nm is deposited, and then a rapid heat treatment is performed at a temperature of approximately 1000° C. Accordingly, the silicide layer 11*s*A is formed on the surfaces of the source extension area 11*c*A and the drain extension area 11*d*A, and the silicide layer 11*s*B is formed on the surfaces of the source extension area 11*c*B and the drain extension area 11*d*B. At the same time, a similar silicide layer 13*gs*A is formed on the surface of the polysilicon layer 13*g* of the stacked gate electrode 13A, a similar silicide layer 13*gs*B is formed on the surface of the polysilicon layer 13*g* of the single-layered gate electrode 13B, and similar silicide layers 13*gs*C and 13*gs*D are respectively formed on the surfaces of the polysilicon layers 13*g* on top of the laminated wiring patterns 13C and 13D in the area 11C.

Figure 10Q:
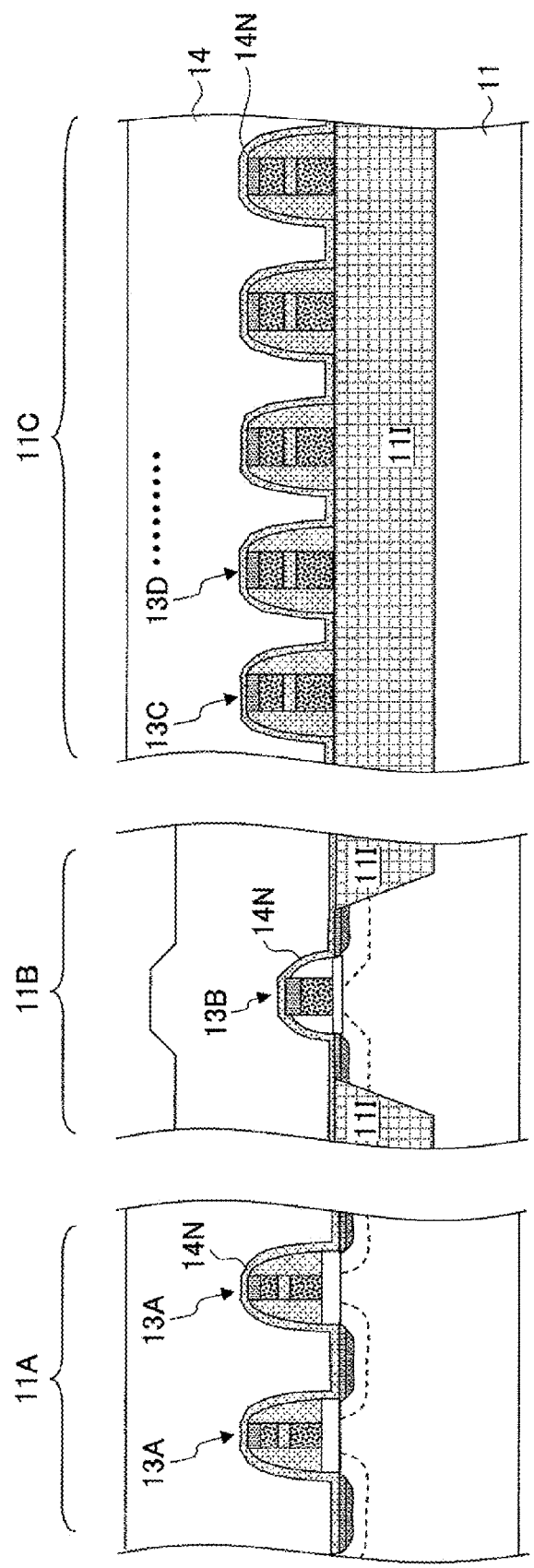
FIG. 10Q illustrates the manufacturing method of the semiconductor integrated circuit device illustrated in FIG. 1 (part 17)

Next, in the step of FIG. 10Q, on the structure of FIG. 10P, a sputtering method is performed to form an SiN film 14N covering the exposed surface of the silicon substrate 11, the element separating structure 11I, the stacked gate electrode 13A, the single-layered gate electrode 13B, and the laminated wiring patterns 13C and 13D. On top of the SiN film 14N, the interlayer insulating film 14 made of a silicon dioxide film is formed by a high-density plasma CVD method.

Figure 10R:
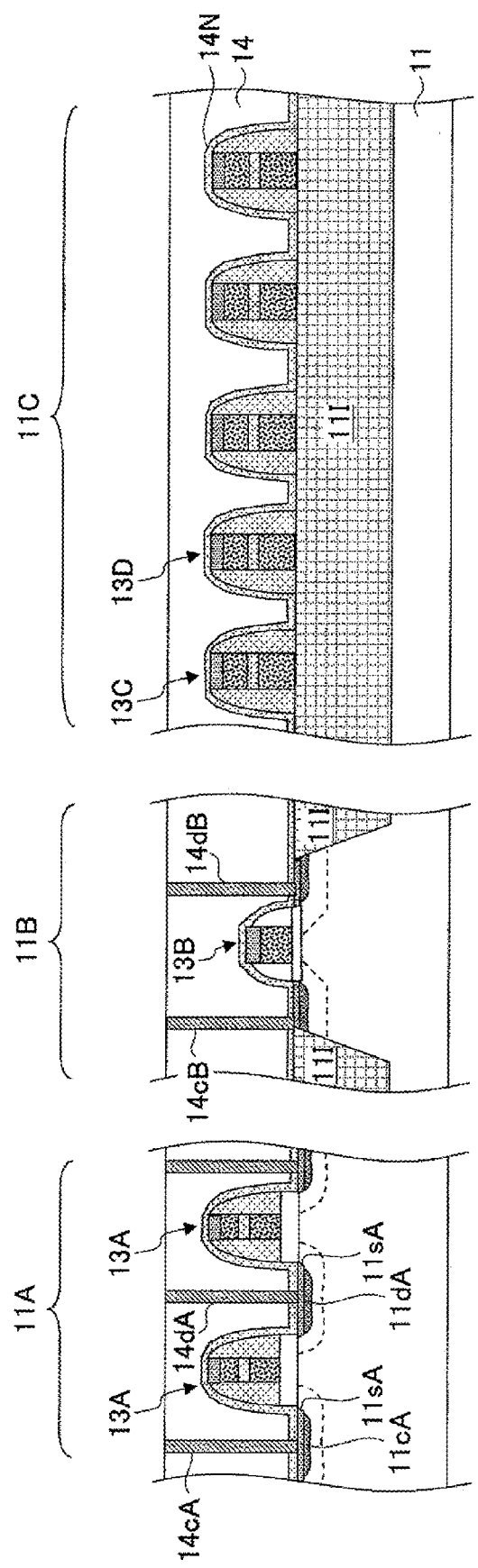
FIG. 10R illustrates the manufacturing method of the semiconductor integrated circuit device illustrated in FIG. 1 (part 18)

Next, in the step of FIG. 10R, the interlayer insulating film 14 is polished by a chemical machine polishing (CMP) method to flatten the surface of the interlayer insulating film 14. The polished interlayer insulating film 14 has a thickness of approximately 400 nm as measured from the surface of the element separating structure 11I. In the step of FIG. 10R, in the element area 11A, the via plugs 14*c*A and 14*d*A are formed in the interlayer insulating film 14 so as to electrically contact the source extension area 11*c*A and the drain extension area 11*d*A via the silicide layer 11*s*A. Furthermore, in the element area 11B, the via plugs 14*c*B and 14*d*B are formed in the interlayer insulating film 14 so as to electrically contact the source extension area 11*c*B and the drain extension area 11*d*B via the silicide layer 11*s*B. The via plugs 14*c*A, 14*d*A, 14*c*B, and 14*d*B may be formed with, for example, tungsten plugs.

Then, in the step of FIG. 10S, the multilayer wiring structure 18 described above is formed on the structure of FIG. 10R.

In the following, a description is given of a method of forming the multilayer wiring structure 18 with reference to FIGS. 11A through 11F, focusing on the method of forming a capacitor element in the area 11C.

Figure 11A:
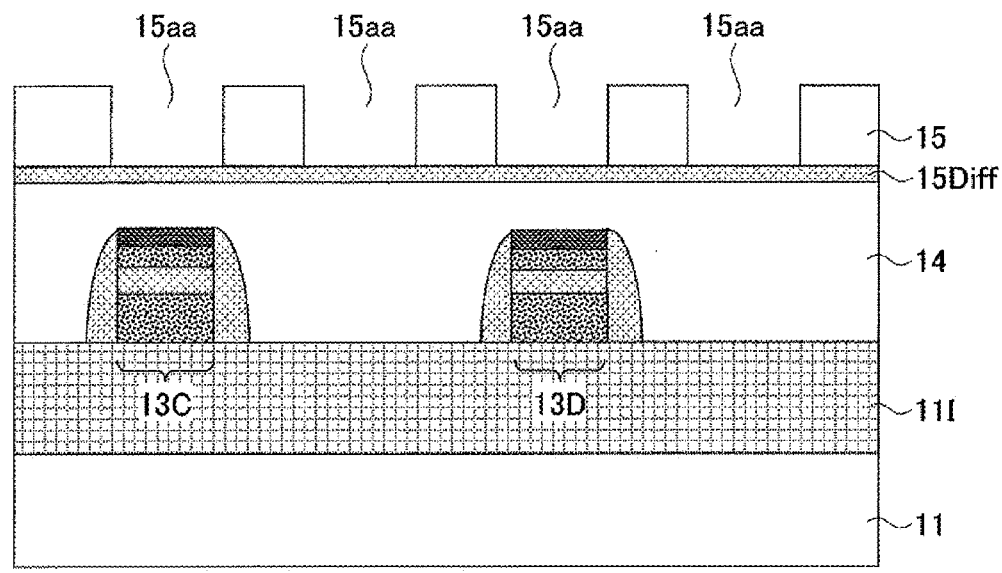
FIG. 11A illustrates details of the step of FIG. 10S (part 1)

Referring to FIG. 11A, in the area 11C, the laminated wiring patterns 13C and 13D are formed in parallel in the element separating area 11I. The laminated wiring patterns 13C and 13D are covered by the interlayer insulating film 14. The top surface of the interlayer insulating film 14 is flattened. On the interlayer insulating film 14, for example, a SiC film 15Diff having a thickness of 50 nm is formed as a film for preventing Cu from diffusing. Furthermore, a so-called low-K dielectric film such as a SiOC film having a thickness of, for example, 200 nm, is formed as the interlayer insulating film 15 on the SiC film 15Diff. Furthermore, in the interlayer insulating film 15, groove parts 15*aa* are repeatedly formed at positions corresponding to the wiring patterns 15C$_1$ and 15C$_2$, by using the SiC film 15Diff as an etching stopper.

Figure 11B:
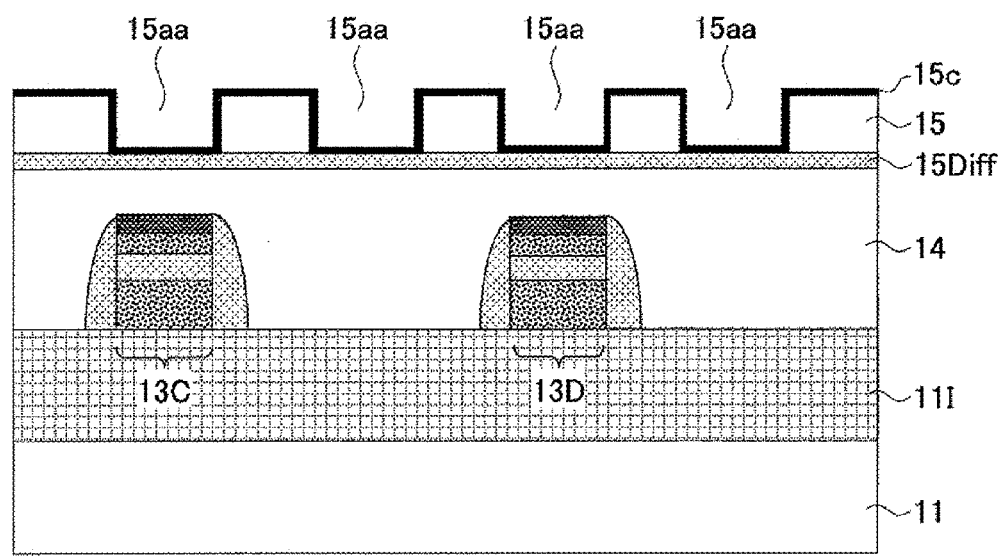
FIG. 11B illustrates details of the step of FIG. 10S (part 2)
Figure 11C:
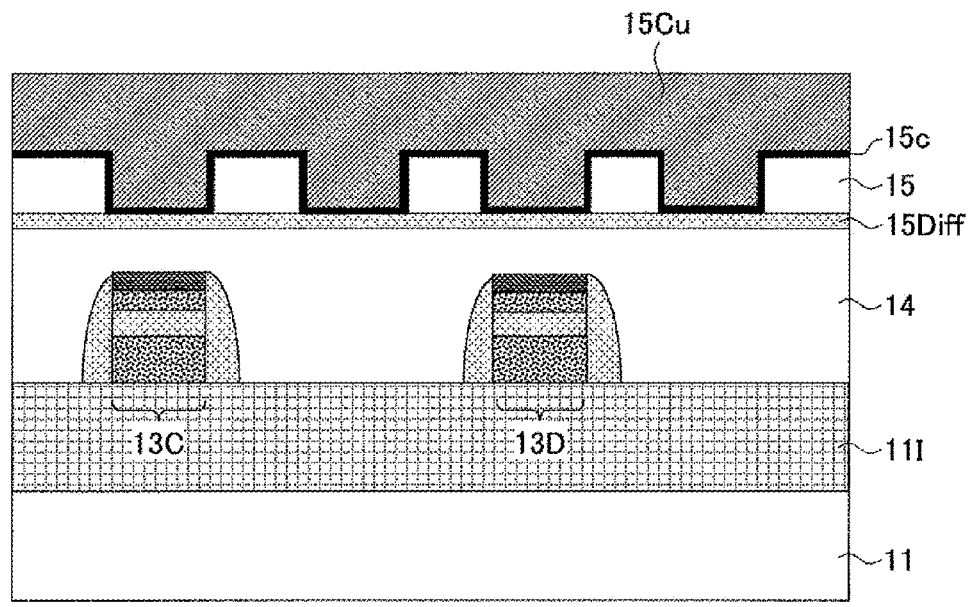
FIG. 11C illustrates details of the step of FIG. 10S (part 3)

Next, in the step of FIG. 11B, the barrier metal film 15c having a laminated structure in which a Ta film and a TaN film are laminated is formed by a sputtering method on the structure of FIG. 11A to have a thickness of several tens nm. In the step of FIG. 11C, a copper (Cu) layer is formed on the structure of FIG. 11B by, for example, a sputtering method or an electrolytic coating method, so as to fill in the groove parts 15aa.

Figure 11D:
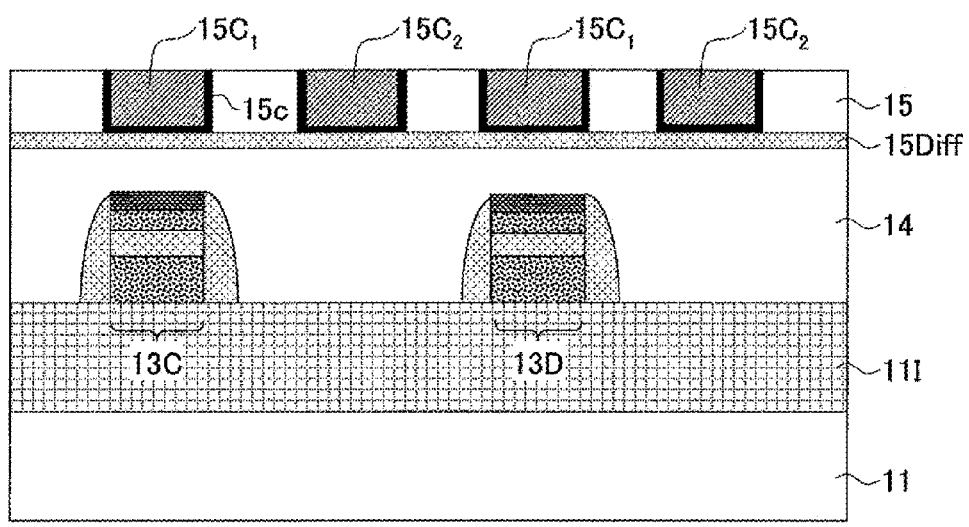
FIG. 11D illustrates details of the step of FIG. 10S (part 4)

Then, in the step of FIG. 11D, excessive parts of a Cu layer 15Cu on the interlayer insulating film 15 are removed by polishing the Cu layer 15Cu by a CMP method, until the top surface of the interlayer insulating film 15 is exposed.

Accordingly, in the interlayer insulating film 15, the wiring patterns $15C_1$ and $15C_2$ filling the groove parts 15aa are formed.

Figure 11E:
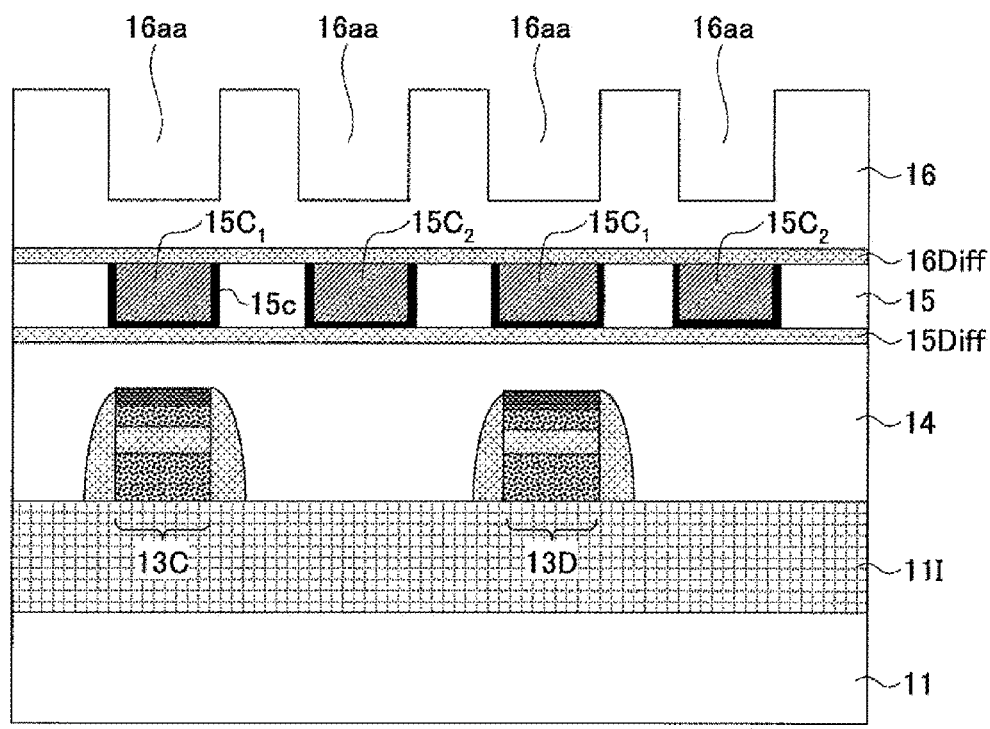
FIG. 11E illustrates details of the step of FIG. 10S (part 5)

Then, in the step of FIG. 11E, on the interlayer insulating film 15, a SiC film 16Diff having a thickness of 50 nm is formed as a film for preventing Cu from diffusing. Then, on the SiC film 16Diff, the interlayer insulating film 16 similar to the interlayer insulating film 15 is formed to have a thickness of, for example, 500 nm. In the interlayer insulating film 16, groove parts 16aa are repeatedly formed at positions corresponding to the wiring patterns $16C_1$ and $16C_2$. The groove parts 16aa are formed only within the interlayer insulating film 16, and therefore the low-K dielectric film constituting the interlayer insulating film 16 is exposed to the side walls and bottom surfaces of the groove parts 16aa.

Figure 11F:
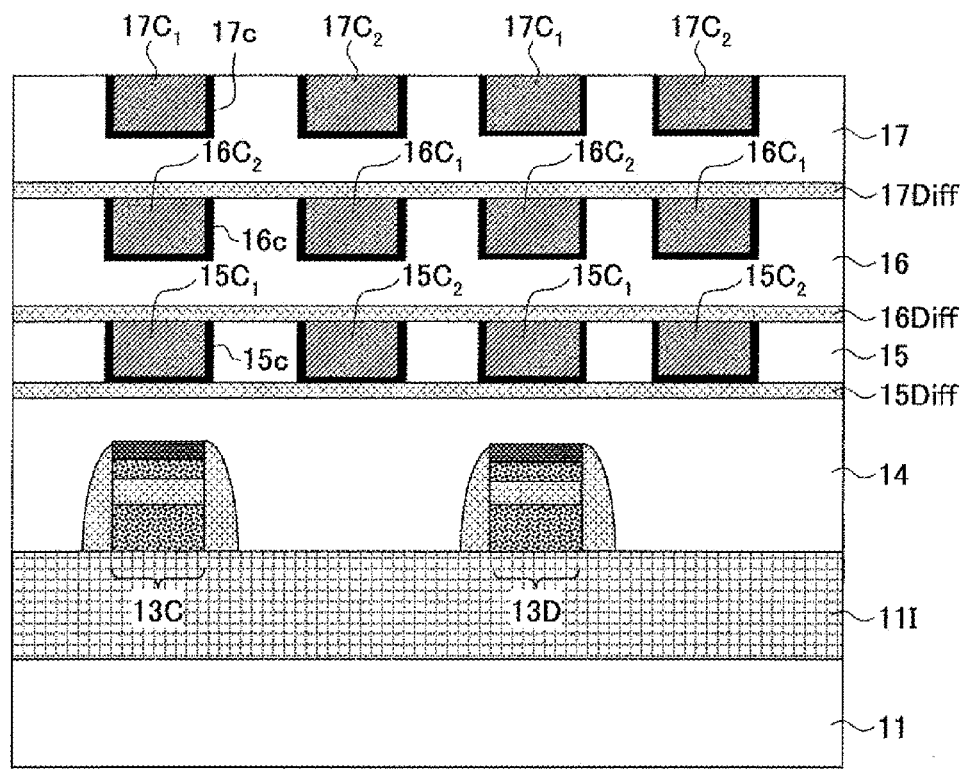
FIG. 11F illustrates details of the step of FIG. 10S (part 6)

Next, in the step of FIG. 11F, on the structure of FIG. 11E, the barrier metal films 16c similar to the barrier metal films 15c are formed by a sputtering method to have a thickness of several tens nm. Furthermore, the groove parts 16aa are filled by copper (Cu) layers, similar to the case of the groove parts 15aa.

Excessive parts of the Cu layer on the interlayer insulating film 16 are removed by polishing the Cu layer by a CMP method, until the top surface of the interlayer insulating film 16 is exposed. Accordingly, in the interlayer insulating film 16, the wiring patterns $16C_1$ and $16C_2$ filling the groove parts 16aa are formed.

By repeating the same procedure, the interlayer insulating film 17 is formed on the interlayer insulating film 16 via a SiC film 17Diff. The wiring patterns $17C_1$ and $17C_2$ are formed in the interlayer insulating film 17 via the barrier metal films 17c.

FIGS. 12A through 12F are for describing a method of forming the via contact Via-$V_1$ in the area 11C, described with reference to FIG. 3.

Referring to FIG. 12A, on the element separating area 11I, there is formed the wiring base part 13CD from which the laminated wiring patterns 13C and 13D extend, as described with reference to FIG. 3. The wiring base part 13CD is covered by the interlayer insulating film 14. The wiring base part 13CD has the same laminated structure as the laminated wiring patterns 13C and 13D.

In the step of FIG. 12A, a via plug 14D made of, for example, tungsten, is formed in the interlayer insulating film 14, so as to contact the wiring base part 13CD. The via plug 14D is formed together with a barrier metal film 14d having a Ti/TiN laminated structure, in the same manner as the via plugs 14cA and 14dA or the via plugs 14cB and 14dB in FIG. 10R. As described above, the top surface of the interlayer insulating film 14 is flattened by the CMP method.

Figure 12B:
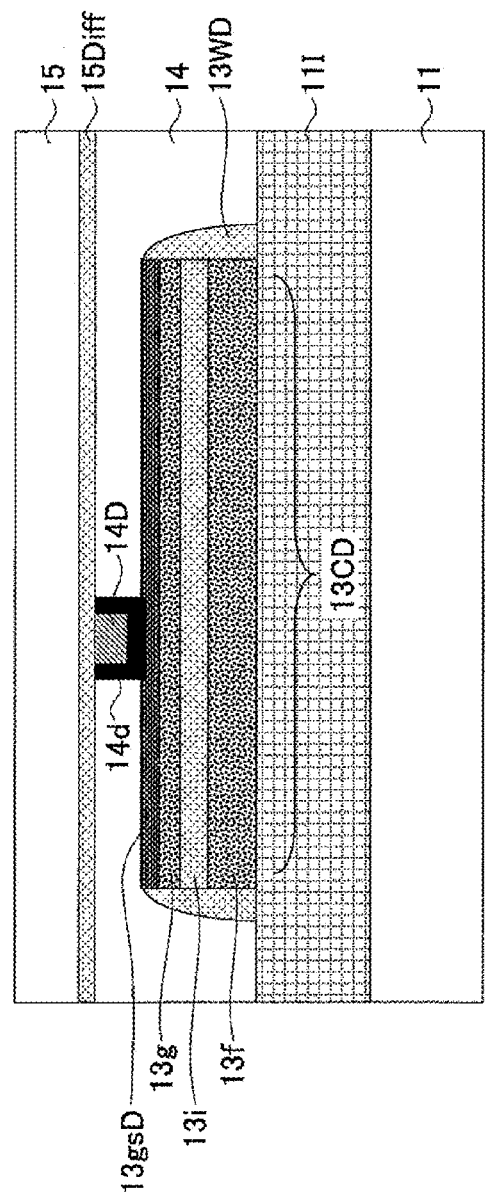
FIG. 12B illustrates details of the process of forming the via contact in the step of FIG. 10S (part 2)
Figure 12C:
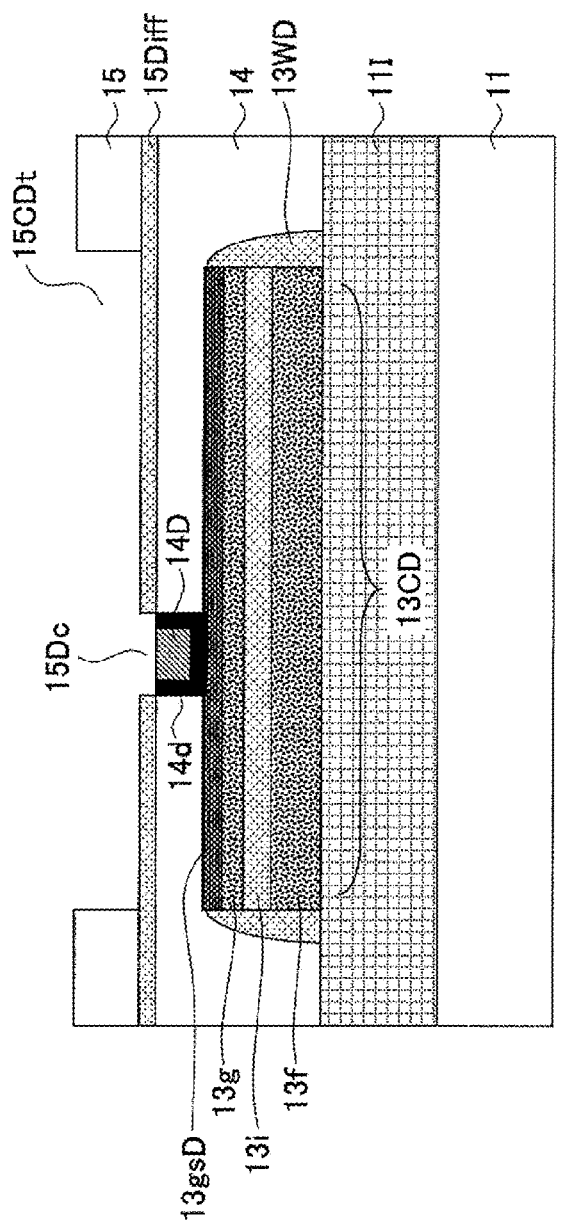
FIG. 12C illustrates details of the process of forming the via contact in the step of FIG. 10S (part 3)

In the step of FIG. 12B, the SiC film 15Diff and the interlayer insulating film 15 are formed on the interlayer insulating film 14 in the same manner as that described with reference to FIG. 11E. In the step of FIG. 12C, a groove part 15CDt is formed in the interlayer insulating film 15 at a position corresponding to the wiring base part 15CD of the wiring patterns $15C_1$ and $15C_2$ described with reference to FIG. 3. Furthermore, a contact hole 15Dc for exposing the via plug 14D is formed in the groove part 15CDt. Alternatively, the contact hole 15Dc may be formed first in the interlayer insulating film 15, and subsequently the groove part 15CDt may be formed.

Figure 12D:
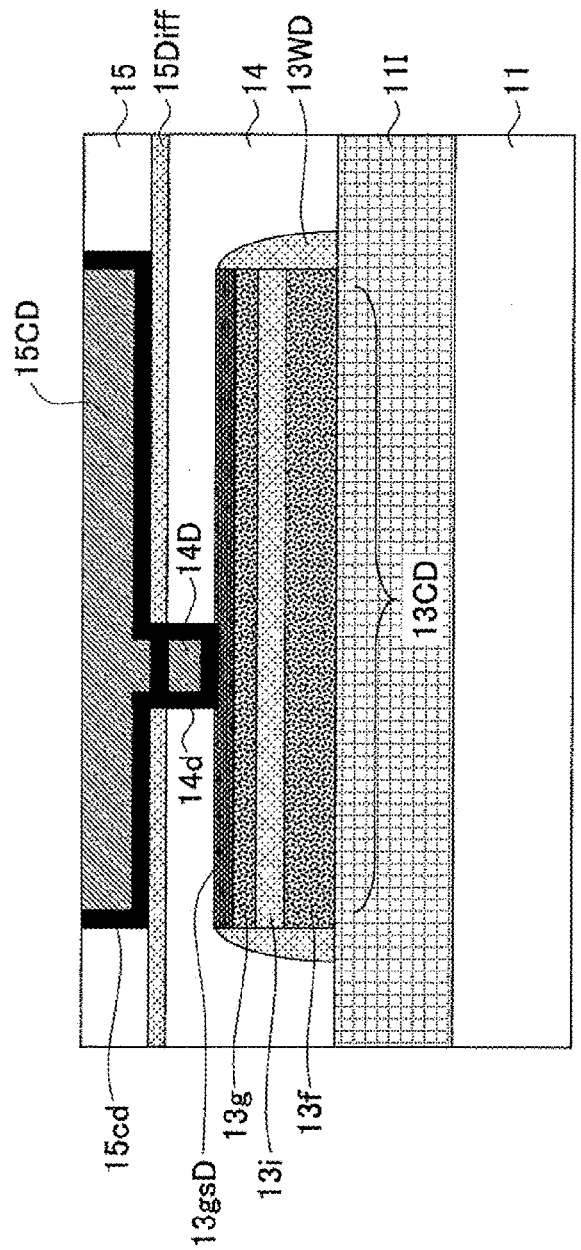
FIG. 12D illustrates details of the process of forming the via contact in the step of FIG. 10S (part 4)

Then, in the step of FIG. 12D, the groove part 15CDt is filled with a Cu layer via a barrier metal film 15cd corresponding to the barrier metal films 15c. Excessive parts of the Cu layer on the interlayer insulating film 15 are removed by a CMP method, so that the groove part 15CDt is filled with a Cu pattern configuring the wiring base part 15CD. As described with reference to FIG. 3, plural wiring patterns $15C_2$ parallel to each other extend from the wiring base part 15CD.

Then, in the step of FIG. 12E, the wiring base part 16CD is formed in the interlayer insulating film 16 with a Cu pattern on the structure of FIG. 12D by a dual damascene process. The wiring base part 16CD is formed together with a Cu via plug 16V contacting the wiring base part 15CD. Then, a wiring base part 17CD is formed in the interlayer insulating film 17 with a Cu pattern on the wiring base part 16CD by a dual damascene process. The wiring base part 17CD is formed together with a Cu via plug 17D contacting the wiring base part 16CD. In FIG. 12E, the position of the via contact Via-$V_1$ is indicated by a dashed line.

Figure 13:
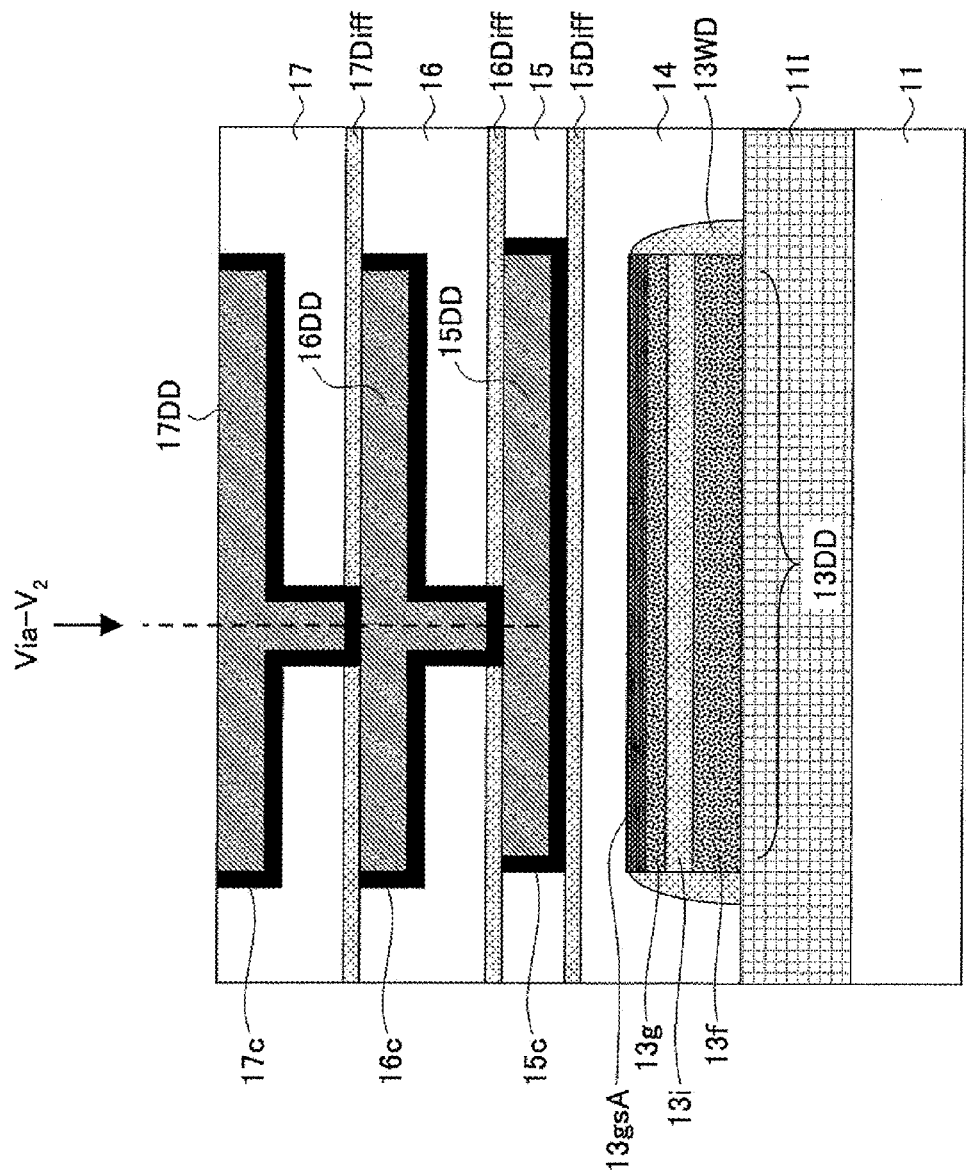
FIG. 13 is a cross-sectional view of a laminated structure of the formed via contact.

Furthermore, as illustrated in FIG. 13, the same laminated structure as that of FIG. 12E is formed. Specifically, the wiring base part 15DD from which the wiring patterns $15C_1$ extend as illustrated in FIG. 3, the wiring base part 16DD from which the wiring patterns $16C_1$ extend as illustrated in FIG. 3, and a wiring base part 17DD from which the wiring patterns $17C_1$ extend (not illustrated in FIG. 3), are respectively formed in the interlayer insulating films 15, 16, and 17, by a dual damascene process. Similar to FIG. 12E, the position of the via contact Via-$V_2$ is indicated by a dashed line in FIG. 13.

In the structure of FIG. 12E, a voltage $V_1$ is supplied to the wiring base part 17CD. In the structure of FIG. 13, a voltage $V_2$ is supplied to the wiring base part 17DD. Accordingly, capacitances are generated in the capacitor element in the area 11C, as illustrated in FIG. 5. The generated capacitances are not affected by the depletion in the polysilicon patterns, and therefore a predetermined capacitance is maintained even if the applied voltage changes. Accordingly, the capacitor element according to the present embodiment is preferable for the purpose of achieving precise capacitance values as in a D/A converter, as described above.

Second Embodiment

Figure 14:
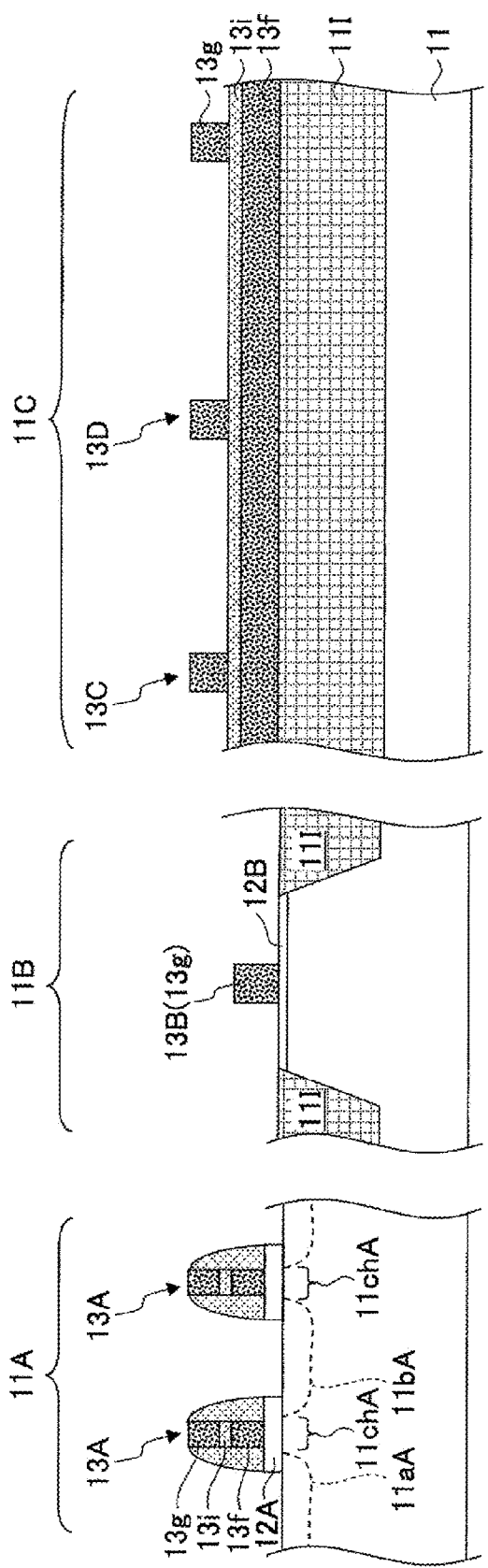
FIG. 14 illustrates a manufacturing method of a semiconductor integrated circuit device according to a second embodiment.

FIG. 14 illustrates part of a method of manufacturing a semiconductor integrated circuit device according to a second embodiment. In FIG. 14, elements corresponding to those described above are denoted by the same reference numerals and are not further described.

In the present embodiment, the polysilicon layer 13f is not subjected to patterning in the step of FIG. 10I of the first embodiment. Consequently, in the present embodiment, during the steps of FIG. 10I through 10K, the polysilicon layer 13f, and the inter-electrode insulating layers 13i and the polysilicon layer 13g above the polysilicon layer 13f are not subjected to patterning, in areas other than the element area 11A.

The step of FIG. 14 corresponds to the step of FIG. 10L. When the polysilicon layer 13g is subjected to patterning in the element area 11B to form the gate electrode 13B, the polysilicon layer 13g is subjected to patterning also in the area 11C by using the insulating film 13i as an etching stopper, to form the laminated wiring patterns 13C and 13D.

Figure 15:
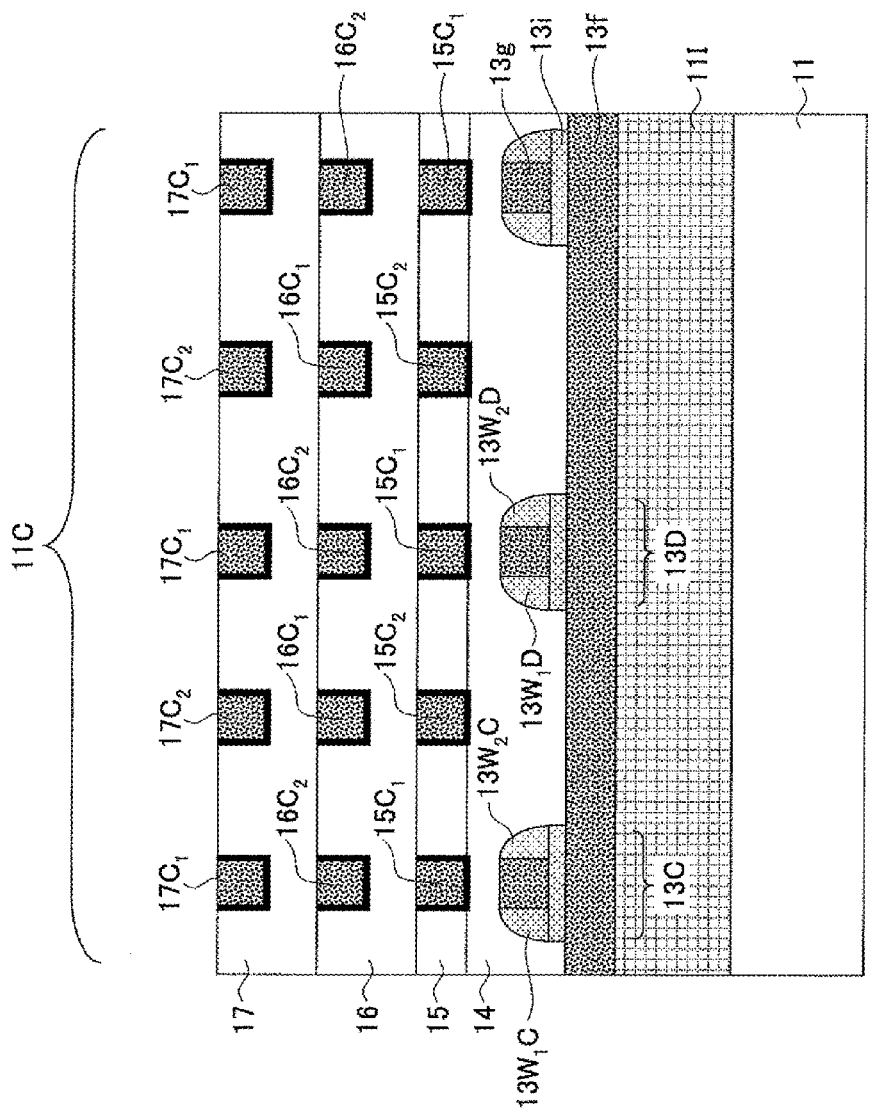
FIG. 15 is a cross-sectional view of a capacitor element according to the second embodiment.

In the present embodiment, in the manufactured semiconductor integrated circuit device, as illustrated in FIG. 15, the polysilicon layer 13f continuously covers the area 11C to enhance the electrical shielding effects of the capacitor element formed on the polysilicon layer 13f.

In the present embodiment, the side wall insulating films 13W$_1$C, 13W$_2$C, 13W$_1$D, and 13W$_2$D in the area 11C are formed on the insulating films 13i as illustrated in FIG. 15. Specifically, the side wall insulating films 13W$_1$C, 13W$_2$C, 13W$_1$D, and 13W$_2$D are formed by depositing an insulating film on the exposed insulating film 13i of the structure of FIG. 14, and then the deposited insulating film is subjected to patterning, in a step corresponding to the step of FIG. 10N of the first embodiment.

The present invention is not limited to the specific embodiments of the electromagnetic current distribution processing device, the electromagnetic current distribution processing method, and the electromagnetic current distribution processing program described herein, and variations and modifications may be made without departing from the scope of the present invention.

According to one embodiment of the present invention, in a semiconductor integrated circuit device, a first wiring pattern is capacitively-coupled not only to a second wiring pattern but also to a fourth electrode pattern. Consequently, in the semiconductor integrated circuit device, with the use of a laminated wiring pattern and a multilayer wiring pattern, it is possible to form a capacitor having a greater volume than that of the conventional technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A manufacturing method of a semiconductor integrated circuit device, the manufacturing method comprising:
    defining a first element area by forming an element separating area on a semiconductor substrate;
    forming a tunnel insulating film in the first element area;
    forming a floating gate above the tunnel insulating film and a first electrode pattern in the element separating area;
    forming a first insulating film above the floating gate and a second insulating film above the first electrode pattern;
    forming a control gate above the first insulating film and a second electrode pattern above the second insulating film;
    forming a source area and a drain area in the semiconductor substrate in the first element area;
    forming a first interlayer insulating film to cover the control gate and the second electrode pattern above the semiconductor substrate;
    forming, in the first interlayer insulating film, a conductive via plug that reaches the second electrode pattern;
    forming, above the first interlayer insulating film in the element separating area, a first wiring pattern capacitively-coupled to the second electrode pattern; and
    forming, above the first interlayer insulating film, a second wiring pattern electrically coupled to the second electrode pattern via the conductive via plug, and capacitively-coupled to the first wiring pattern.
2. The manufacturing method according to claim 1, further comprising:
    forming a silicide layer on a surface of the second electrode pattern.
3. The manufacturing method according to claim 1, further comprising:
    flattening a surface of the first interlayer insulating film after the forming of the first interlayer insulating film and before the forming of the conductive via plug.
4. The manufacturing method according to claim 1, further comprising:
    defining a second element area by forming the element separating area on the semiconductor substrate; and
    forming a semiconductor device including a single-layered gate electrode in the second element area, before the forming of the first interlayer insulating film.

* * * * *